US012604472B2

(12) United States Patent
Cho et al.

(10) Patent No.: US 12,604,472 B2
(45) Date of Patent: Apr. 14, 2026

(54) SEMICONDUCTOR DEVICE INCLUDING STACK STRUCTURE AND TRENCHES

(71) Applicant: SAMSUNG ELECTRONICS CO., LTD., Suwon-si (KR)

(72) Inventors: Seung Hyun Cho, Seoul (KR); Kwang Ho Lee, Hwaseong-si (KR); Ji Hwan Yu, Suwon-si (KR); Jong Soo Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 347 days.

(21) Appl. No.: 17/983,520

(22) Filed: Nov. 9, 2022

(65) Prior Publication Data

US 2023/0081495 A1 Mar. 16, 2023

Related U.S. Application Data

(63) Continuation of application No. 17/354,516, filed on Jun. 22, 2021, now Pat. No. 12,402,308, which is a
(Continued)

(30) Foreign Application Priority Data

Aug. 22, 2017 (KR) ........................ 10-2017-0106033

(51) Int. Cl.
*H10B 43/27* (2023.01)
*H01L 21/768* (2006.01)
(Continued)

(52) U.S. Cl.
CPC ....... *H10B 43/27* (2023.02); *H01L 21/76816* (2013.01); *H01L 21/76877* (2013.01);
(Continued)

(58) Field of Classification Search
CPC ........ H10B 43/17; H10B 43/35; H10B 43/10; H01L 21/76816; H01L 21/76877; H01L 23/5226; H01L 23/528
See application file for complete search history.

(56) References Cited

U.S. PATENT DOCUMENTS 9,455,269 B1 9/2016 Noda
9,502,429 B2 11/2016 Hironaga
(Continued)

FOREIGN PATENT DOCUMENTS

CN 103125023 5/2013
CN 104766865 7/2015
(Continued)

OTHER PUBLICATIONS

Chinese Office Action issued in corresponding Chinese patent application No. 201810653341.7 on Mar. 30, 2023.
(Continued)

*Primary Examiner* — Timor Karimy
(74) *Attorney, Agent, or Firm* — Morgan, Lewis & Bockius LLP

(57) ABSTRACT

A semiconductor device includes a plurality of blocks on a substrate. Trenches are disposed between the plurality of blocks. Conductive patterns are formed inside the trenches. A lower end of an outermost trench among the trenches is formed at a level higher than a level of a lower end of the trench adjacent to the outermost trench. Each of the blocks includes insulating layers and gate electrodes, which are alternately and repeatedly stacked. Pillars pass through the insulating layers and the gate electrodes along a direction orthogonal to an upper surface of the substrate.

18 Claims, 18 Drawing Sheets

Related U.S. Application Data continuation of application No. 16/890,400, filed on Jun. 2, 2020, now Pat. No. 11,056,506, which is a continuation of application No. 15/941,800, filed on Mar. 30, 2018, now Pat. No. 10,707,229.

(51) Int. Cl.

| | | |
|---|---|---|
| *H01L 23/522* | (2006.01) | |
| *H01L 23/528* | (2006.01) | |
| *H10B 43/10* | (2023.01) | |
| *H10B 43/35* | (2023.01) | |

(52) U.S. Cl.

CPC ........ *H01L 23/5226* (2013.01); *H01L 23/528* (2013.01); *H10B 43/10* (2023.02); *H10B 43/35* (2023.02)

(56) References Cited

U.S. PATENT DOCUMENTS

| | | | |
|---|---|---|---|
| 9,536,897 | B2 | 1/2017 | Yoo et al. |
| 9,576,664 | B2 | 2/2017 | Son et al. |
| 9,577,085 | B2 | 2/2017 | Lee |
| 9,741,733 | B2 | 8/2017 | Lim et al. |
| 10,038,009 | B2 | 7/2018 | Lim et al. |
| 10,707,229 | B2 | 7/2020 | Cho et al. |
| 10,797,068 | B2 | 10/2020 | Lim et al. |
| 11,011,543 | B2 | 5/2021 | Lim et al. |
| 11,056,506 | B2 | 7/2021 | Cho et al. |
| 2002/0115257 | A1 | 8/2002 | Inagawa et al. |
| 2010/0176440 | A1 | 7/2010 | Omura |
| 2011/0019480 | A1 | 1/2011 | Kito |
| 2011/0115010 | A1 | 5/2011 | Shim |
| 2012/0208347 | A1 | 8/2012 | Hwang et al. |
| 2013/0075784 | A1 | 3/2013 | Ikeda |
| 2015/0069498 | A1 | 3/2015 | Konno et al. |
| 2015/0145014 | A1 | 5/2015 | Shin |
| 2015/0194435 | A1 | 7/2015 | Lee |
| 2015/0255486 | A1 | 9/2015 | Kameoka et al. |
| 2015/0340376 | A1 | 11/2015 | Park et al. |
| 2015/0372101 | A1 | 12/2015 | Lee et al. |
| 2016/0027796 | A1 | 1/2016 | Yang et al. |
| 2016/0049423 | A1 | 2/2016 | Yoo et al. |
| 2016/0111441 | A1 | 4/2016 | Park |
| 2016/0216610 | A1 | 7/2016 | Park et al. |
| 2016/0268287 | A1 | 9/2016 | Park et al. |
| 2016/0268302 | A1 | 9/2016 | Lee et al. |
| 2017/0170273 | A1 | 6/2017 | Naito |
| 2017/0358590 | A1 * | 12/2017 | Kang ..................... H10B 43/35 |
| 2018/0047744 | A1 * | 2/2018 | Utsumi ............... G11C 29/022 |
| 2018/0151672 | A1 | 5/2018 | Choi et al. |
| 2019/0067320 | A1 | 2/2019 | Cho et al. |
| 2020/0303412 | A1 | 9/2020 | Cho et al. |
| 2021/0313352 | A1 | 10/2021 | Cho et al. |

FOREIGN PATENT DOCUMENTS

| | | |
|---|---|---|
| KR | 10-2015-0133914 | 12/2015 |
| KR | 10-2016-0013765 | 2/2016 |
| KR | 10-2016-0020019 | 2/2016 |
| KR | 10-2016-0069903 | 6/2016 |
| KR | 10-2016-0071890 | 6/2016 |

OTHER PUBLICATIONS

Office Action Issued in Corresponding U.S. Appl. No. 17/354,516 on Oct. 24, 2024.

Notice of Allowance issued in corresponding Korean Patent Application No. 10-2017-0106033 on Sep. 30, 2022.

Chinese Office Action issued in corresponding Chinese patent application No. 201810653341.7 on Oct. 12, 2023.

Office Action Issued in Corresponding U.S. Appl. No. 17/354,516 on Jun. 27, 2024.

Office Action dated May 6, 2025 issued in U.S. Appl. No. 18/618,451. (Note: US 2018/0047744 A1 cited therein is already of record).

Notice of Allowance dated Apr. 28, 2025 issued in U.S. Appl. No. 17/354,516. (Note: US 2015/0255486 A1 cited therein is already of record).

* cited by examiner

SEMICONDUCTOR DEVICE INCLUDING STACK STRUCTURE AND TRENCHES

CROSS-REFERENCE TO RELATED APPLICATIONS

This U.S. non-provisional patent application is a continuation of U.S. patent application Ser. No. 17/354,516 filed on Jun. 22, 2021, which is a continuation of U.S. patent application Ser. No. 16/890,400 filed on Jun. 2, 2020, now U.S. Pat. No. 11,056,506 issued on Jul. 6, 2021, which is a continuation of U.S. patent application Ser. No. 15/941,800 filed on Mar. 30, 2018, now U.S. Patent No. 10,707,229 issued on Jul. 7, 2020, which claims priority under 35 U.S.C. § 119 to Korean Patent Application No. 10-2017-0106033, filed on Aug. 22, 2017, in the Korean Intellectual Property Office (KIPO), the disclosures of which are incorporated by reference herein in their entireties.

1. Technical Field

Exemplary embodiments of the present inventive concept relate to a semiconductor device, and more particularly to a semiconductor device including a stack structure and trenches.

2. Discussion of Related Art

A degree of integration of semiconductor devices may be increased by the lighting, thinning, and shortening of electronic devices. As an example, a technique using a stack structure in which insulating layers and electrode layers are alternately and repeatedly stacked on a substrate has been attempted. A plurality of cell blocks may be defined by a plurality of trenches which vertically pass through the stack structure and are in parallel. Each of the trenches may have a relatively high aspect ratio. In a semiconductor device including trenches, an outermost trench among the trenches may be vulnerable to various defects caused by mold leaning.

SUMMARY

An exemplary embodiment of the present inventive concept provides a semiconductor device having a reduced number of detects occurring at edges of a cell array region and a relatively high degree of integration.

An exemplary embodiment of the present inventive concept provides a method of forming a semiconductor device with a reduced number of defects occurring at edges of a cell array region and a relatively high degree of integration.

A semiconductor device according to an exemplary embodiment of the present inventive concept includes a plurality of blocks on a substrate. Trenches are disposed between the plurality of blocks. Conductive patterns are formed inside the trenches. A lower end of an outermost trench among the trenches is formed at a level higher than a level of a lower end of the trench adjacent to the outermost trench. Each of the blocks includes insulating layers and gate electrodes, which are alternately and repeatedly stacked. Pillars pass through the insulating layers and the gate electrodes along a direction orthogonal to an upper surface of the substrate.

A semiconductor device according to an exemplary embodiment of the present inventive concept includes a substrate having a main block region and a dummy block region which is continuous with the main block region. A plurality of main blocks are formed in the main block region on the substrate. A plurality of dummy blocks are formed in the dummy block region on the substrate. A plurality of main trenches are disposed between the main blocks. A plurality of dummy trenches are disposed between the dummy blocks. Main source lines are formed inside the main trenches, and dummy source lines are formed inside the dummy trenches. Each of the main blocks and the dummy blocks includes insulating layers and gate electrodes which are alternately and repeatedly stacked. Pillars are dimensioned and positioned to pass through the insulating layers and the gate electrodes along a direction orthogonal to an upper surface of the substrate. A lower end of an outermost dummy source line among the dummy source lines is formed at a level higher than levels of lower ends of the main source lines.

A semiconductor device according to an exemplary embodiment of the present inventive concept includes a plurality of main blocks and a plurality of dummy blocks on a substrate. Main trenches are between the main blocks. Dummy trenches are between the dummy blocks. Main source lines are formed inside the main trenches. Dummy source lines are formed inside the dummy trenches. Each of the main blocks and the dummy blocks includes insulating layers and gate electrodes which are alternately and repeatedly stacked. Pillars are dimensioned and positioned to pass through the insulating layers and the gate electrodes along a direction orthogonal to an upper surface of the substrate. At least one dummy trench selected from among the dummy trenches has a width different from a width of each of the main trenches.

BRIEF DESCRIPTION OF THE DRAWINGS

The above and other objects, features and aspects of the present inventive concept will become more apparent to those of ordinary skill in the art by describing exemplary embodiments thereof in detail with reference to the accompanying drawings, in which:

Figure 3:
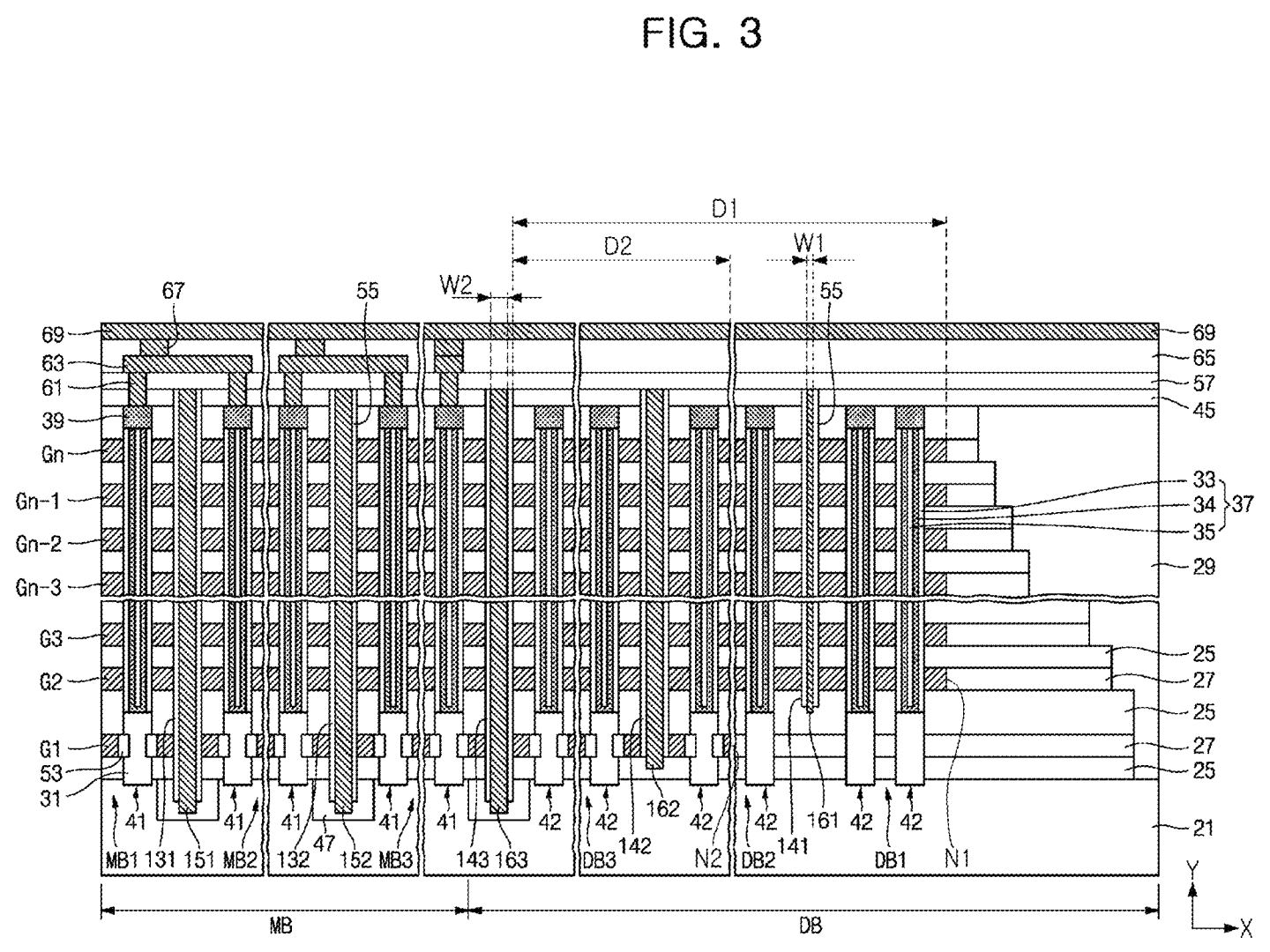

FIGS. 1 to 6 are cross-sectional views illustrating a semiconductor device according to an exemplary embodiment of the present inventive concept;

FIG. 9 is a partial cross-sectional view of a semiconductor device according to an exemplary embodiment of the present inventive concept;

FIGS. 11 to 18 are cross-sectional views taken along line I-I' of FIG. 10 illustrating a method of forming a semiconductor device according to an exemplary embodiment of the present inventive concept.

DETAILED DESCRIPTION OF EXEMPLARY EMBODIMENTS

FIGS. 1 to 6 are cross-sectional views illustrating a semiconductor device according to an exemplary embodiment of the present inventive concept. FIGS. 7 and 8 are each partially enlarged views illustrating a part of FIG. 1. A semiconductor device according to an exemplary embodiment of the present inventive concept may include a flash memory such as a vertical-NAND (VNAND) or a three dimensional NAND (3D-NAND) memory.

Figure 1:
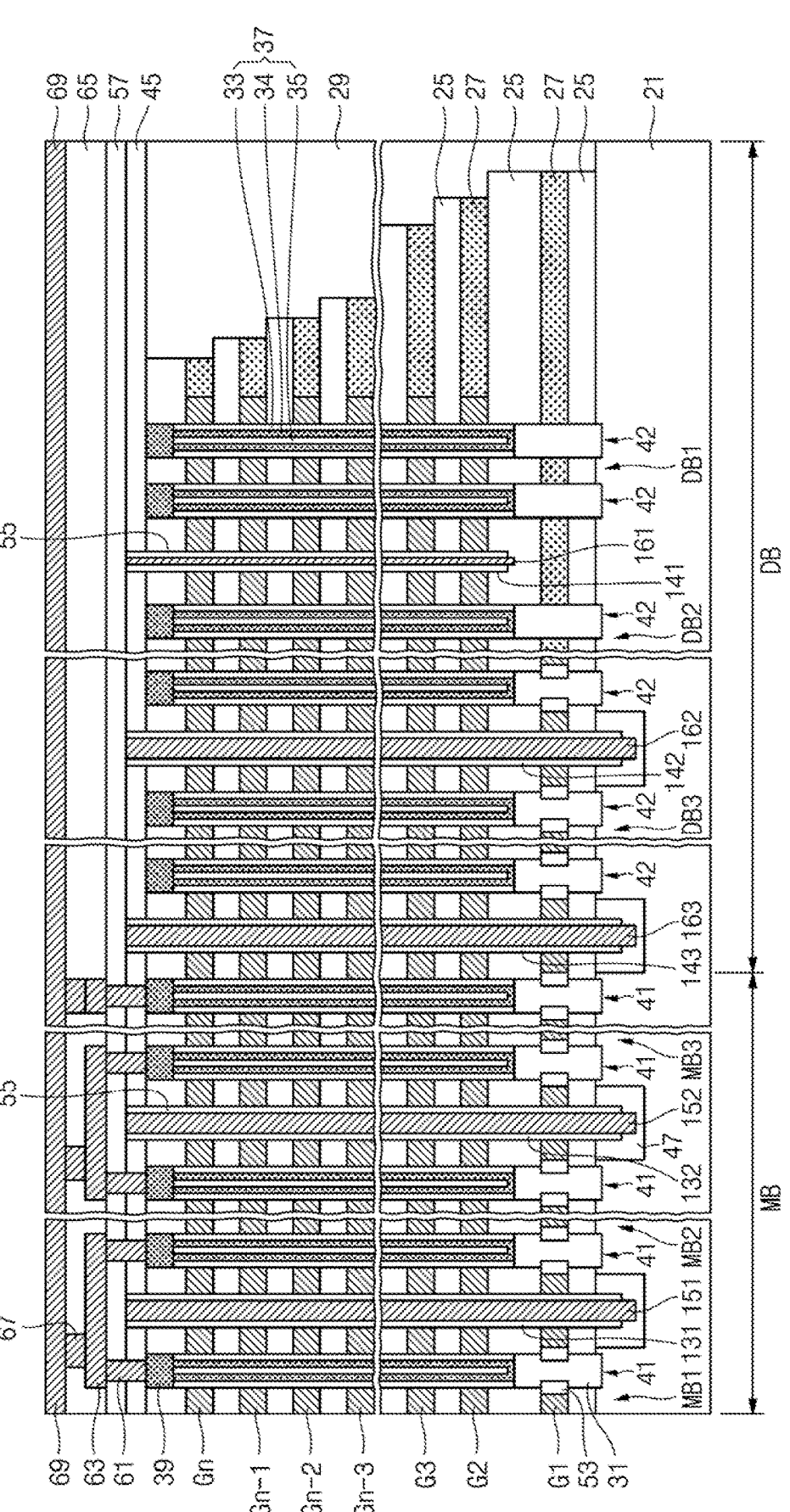

Referring to FIG. 1, a semiconductor device according to an exemplary embodiment of the present inventive concept may include a cell array region having a main block region MB and a dummy block region DB. The dummy block region DB may be continuous with the main block region MB. The dummy block region DB may be provided at an edge of the cell array region. As an example, a substrate 21 may include the dummy block region DB and the main block region MB.

The semiconductor device may include insulating layers 25, mold layers 27, a first insulating interlayer 29, pillars 41 and 42, a second insulating interlayer 45, trenches 131, 132, 141, 142, and 143, impurity regions 47, a gate insulating layer 53, gate electrodes G1 to Gn, a spacer 55, source lines 151, 152, 161, 162, and 163, a third insulating interlayer 57, first bit plugs 61, sub-bit lines 63, a fourth insulating interlayer 65, second bit plugs 67, and bit lines 69, which are formed on a substrate 21 having the main block region MB and the dummy block region DB.

The pillars 41 and 42 may include cell pillars 41 formed in the main block region DB and dummy pillars 42 formed in the dummy block region DB. Each of the pillars 41 and 42 may include a semiconductor pattern 31, a channel structure 37, and a conductive pad 39. The channel structure 37 may include an information storage pattern 33, a channel pattern 34, and a core pattern 35.

The trenches 131, 132, 141, 142, and 143 may include a first main trench 131, a second main trench 132, a first dummy trench 141, a second dummy trench 142, and a third dummy trench 143. The trenches 131, 132, 141, 142, and 143 may be positioned in-parallel with each other. For example, an extending direction of each of the trenches 131, 132, 141, 142, and 143 may extend along a direction orthogonal to an upper surface of the substrate 21, and the extending directions of the trenches 131, 132, 141, 142, and 143 may be substantially parallel with each other. In an exemplary embodiment of the present inventive concept, the trenches 131, 132, 141, 142, and 143 may be referred to as a word line cut (WLCUT) or a common source line (CSL) trench. A first main block MB1, a second main block MB2, a third main block MB3, a first dummy block DB1, a second dummy block DB2, and a third dummy block DB3 may be defined by the trenches 131, 132, 141, 142, and 143.

The first main block MB1, the second main block MB2, and the third main block MB3 may be defined in the main block region MB. The first dummy block DB1, the second dummy block DB2, and the third dummy block DB3 may be defined in the dummy block region DB. In an exemplary embodiment of the present inventive concept, the second dummy block DB2 and the third dummy block DB3 may be selectively omitted. In an exemplary embodiment of the present inventive concept, the dummy block region DB may include 4 to 8 dummy blocks, but exemplary embodiments of the present inventive concept are not limited thereto.

Each of the first main block MB1, the second main block MB2, the third main block MB3, the first dummy block DB1, the second dummy block DB2, and the third dummy block DB3 may include a stack structure in which the insulating layers 25 and the gate electrodes G1 to Gn are alternately and repeatedly stacked. Each of the first main block MB1, the second main block MB2, and the third main block MB3 may include the cell pillars 41 perpendicularly passing through the insulating layers 25 and the gate electrodes G1 to Gn (e.g., along the direction orthogonal to the upper surface of the substrate 21). Each of the first dummy block DB1, the second dummy block DB2, and the third dummy block DB3 may include the dummy pillars 42. The mold layers 27 may partially remain in the first dummy block DB1 and the second dummy block DB2. The mold layers 27 may be disposed between the insulating layers 25. Each of the mold layers 27 may be formed at a level substantially the same as a level of each of the gate electrodes G1 to Gn. The mold layers 27 may be in direct contact with side surfaces of the gate electrodes G1 to Gn. As an example, each of the mold layers 27 may be disposed on (e.g., may be in direct contact with) a portion of an upper surface of a respective insulating layer 25. For example, each of the mold layers 27 may be disposed on may be in direct contact with) a portion of an upper surface of a respective insulating layer 25 on which a respective gate electrode (e.g., one of gate electrodes G1 to Gn) is not disposed. Thus, a respective gate electrode may be disposed on a first portion of a respective insulating layer 25, while a mold layer 27 is disposed on a second portion of the respective insulating layer 25.

A first gate electrode G1 may correspond to a ground selection line GSL. Each of a second gate electrode G2 to an $(n-2)^{th}$ gate electrode Gn-2 may correspond to a control gate line. Each of an $(n-1)^{th}$ gate electrode Gn-1 and an $n^{th}$ gate electrode Gn may correspond to a string selection line (SSL) or a drain selection line (DSL).

The first dummy block DB1 may be defined in an outermost region of the dummy block region DB (e.g., a region of the dummy block region relatively furthest away from the main block region MB). The first dummy trench 141 may be formed between the first dummy block DB1 and the second dummy block DB2. The first dummy trench 141 may be formed as an outermost trench among the trenches 131, 132, 141, 142, and 143. The first main trench 131, the second main trench 132, the second dummy trench 142, and the third dummy trench 143 may perpendicularly pass completely through the insulating layers 25 and the gate electrodes G1 to Gn (e.g., along the direction orthogonal to the upper surface of the substrate 21). Lower ends of the first main trench 131, the second main trench 132, the second dummy trench 142, and the third dummy trench 143 may be formed at levels lower than a level of an upper end of the substrate 21.

A lower end of the first dummy trench 141 may be formed at a level higher than the levels of the lower ends of the first main trench 131, the second main trench 132, the second dummy trench 142, and the third dummy trench 143. In an exemplary embodiment of the present inventive concept, the lower end of the first dummy trench 141 may be formed at a level higher than a level of a lowest layer among the mold layers 27. Lateral widths of the first main trench 131, the second main trench 132, the second dummy trench 142, and the third dummy trench 143 may be substantially the same as each other. For example, the lateral widths may be the same as each other along a direction parallel to the upper surface of the substrate 21. A lateral width of the first dummy trench 141 may be smaller than the lateral width of each of the first main trench 131, the second main trench 132, the second dummy trench 142, and the third dummy trench 143. In this case, a lateral width W1 of the corresponding conductive pattern filling the first dummy trench 141 may be smaller than the lateral width W2 of a corresponding conductive pattern respectively filling each of the first main trench 131, the second main trench 132, the second dummy trench 142, and the third dummy trench 143.

In an exemplary embodiment of the present inventive concept, the lower end of the first dummy trench 141 may be formed at a level higher than a level of the first gate electrode G1. The lower end of the first dummy trench 141 may be formed between the first gate electrode G1 and the second gate electrode G2. The lower end of the first dummy trench 141 may be formed between the lowest layer among the mold layers 27 and the second gate electrode G2.

The impurity regions 47 may be in a position corresponding to a common source region. The source lines 151, 152, 161, 162, and 163 may include a first main source line 151, a second main source line 152, a first dummy source line 161, a second dummy source line 162, and a third dummy source line 163.

The first main source line 151, the second main source line 152, the second dummy source line 162, and the third dummy source line 163 may each be in direct contact with a respective one of the impurity regions 47. A lower end of the first dummy source line 161 may be in direct contact with a second lowest layer among the insulating layers 25. For example, the lower end of the first dummy source line 161 may be positioned between an upper surface and a lower surface of the second lowest layer among the insulating layers 25.

Lower ends of the first main source line 151, the second main source line 152, the second dummy source line 162, and the third dummy source line 163 may be formed at levels lower than the level of the upper end of the substrate 21. The lower end of the first dummy source line 161 may be formed at a level higher than the levels of the lower ends of the first main source line 151, the second main source line 152, the second dummy source line 162, and the third dummy source line 163. In an exemplary embodiment of the present inventive concept, the lower end of the first dummy source line 161 may be formed at a level higher than the lowest layer among the mold layers 27. Lateral widths of the first main source line 151, the second main source line 152, the second dummy source line 162, and the third dummy source line 163 may be substantially the same as each other. A lateral width of the first dummy source line 161 may be smaller than the lateral width of each of the first main source line 151, the second main source line 152, the second dummy source line 162, and the third dummy source line 163.

In an exemplary embodiment of the present inventive concept, the lower end of the first dummy source line 161 may be formed at a level higher than the level of the first gate electrode G1. The lower end of the first dummy source line 161 may be formed between the first gate electrode G1 and the second gate electrode G2. The lower end of the first dummy source line 161 may be formed between the lowest layer among the mold layers 27 and the second gate electrode G2.

According to another embodiment of the present inventive concept (see, e.g., FIG. 1), a semiconductor device may include the substrate 21 including the main block region MB and the dummy block region DB. At least two main block pillars (e.g., 41) may be positioned in the main block region MB. At least two dummy pillars (e.g., 42) may be positioned in the dummy block region DB. At least two main block trenches (e.g., 131 and 132) may be positioned in the main block region MB. The at least two main block pillars may separate the at least two main block trenches from each other. A main source line (e.g., 151 and 152) may be positioned in each of the at least two main block trenches. At least two dummy block trenches 141, 142 and/or 143) may be positioned in the dummy block region DB. A dummy source line (e.g., 161, 162 or 163) may be positioned in each of the at least two dummy block trenches. Gate electrodes (e.g., Gn to G1) and insulating layers (e.g., 25) may be alternately and repeatedly stacked above the substrate 21. An extending direction of each of the gate electrodes and insulating layers may be perpendicular to an extending direction of the at least two main block pillars and the at least two dummy pillars. A lowermost level of one of the at least two dummy block trenches (e.g., 141) may be spaced further apart from an upper surface of the substrate 21 than a lowermost level of each of the at least two main block trenches e.g., 131 and 132).

Figure 2:
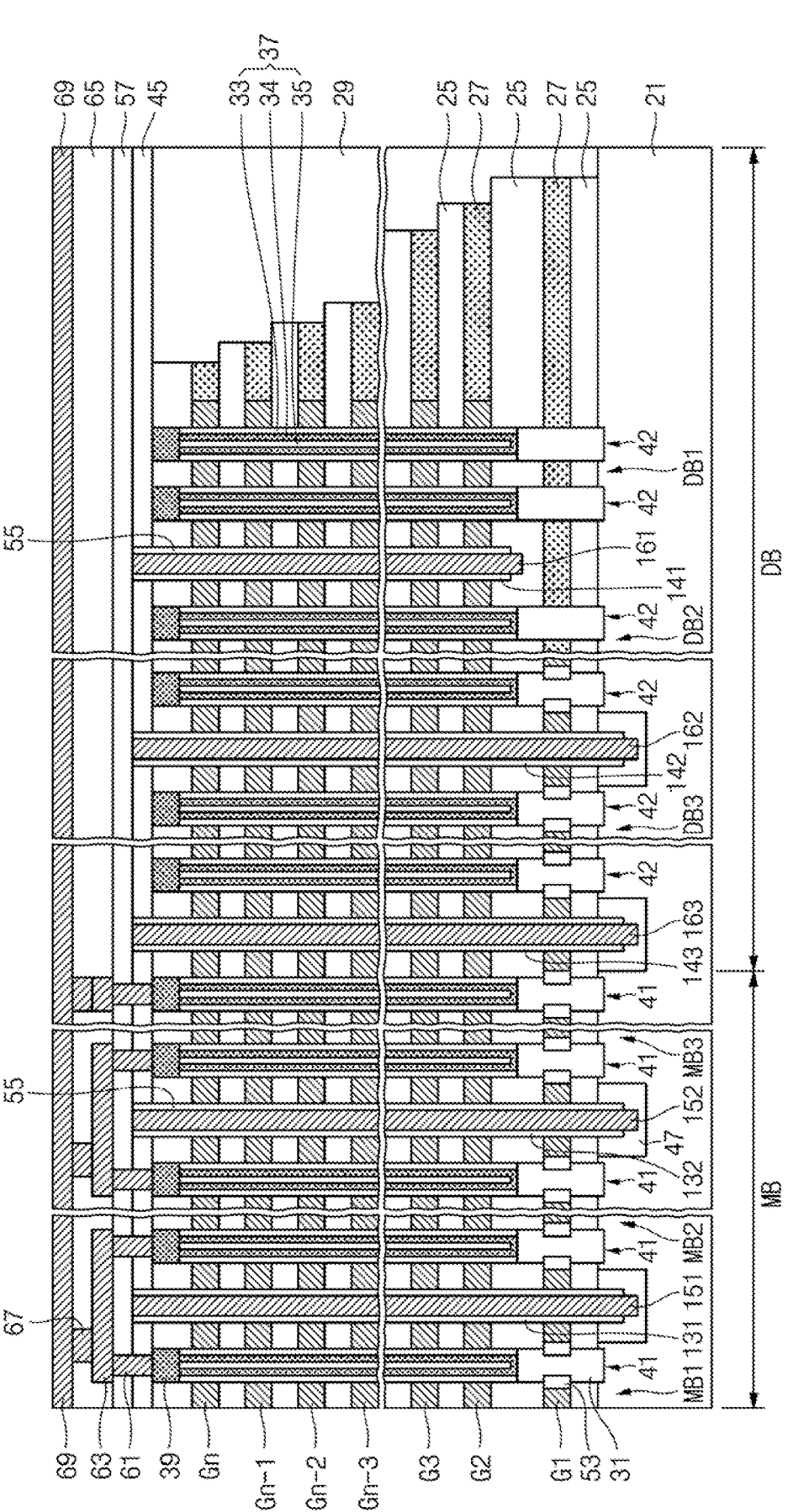

Referring to FIG. 2, a lateral width of a first dummy trench 141 may be substantially the same as a lateral width of each of a first main trench 131, a second main trench 132, a second dummy trench 142, and a third dummy trench 143. A lower end of the first dummy trench 141 may be formed at a level higher than levels of lower ends of the first main trench 131, the second main trench 132, the second dummy trench 142, and the third dummy trench 143. In an exemplary embodiment of the present inventive concept, the lower end of the first dummy trench 141 may be formed at a level higher than a level of a lowest layer among mold layers 27.

A lateral width of a first dummy source line 161 may be substantially the same as a lateral width of each of a first main source line 151, a second main source line 152, a second dummy source line 162, and a third dummy source line 163. The lower end of the first dummy source line 161 may be formed at a level higher than levels of lower ends of the first main source line 151, the second main source line 152, the second dummy source line 162, and the third dummy source line 163. In an exemplary embodiment of the present inventive concept, the lower end of the first dummy source line 161 may be formed at a level higher than the level of the lowest layer among the mold layers 27.

Referring to MG, 3, a lower end of a second dummy trench 142 may be formed at a level higher than levels of lower ends of a first main trench 131, a second main trench 132, and a third dummy trench 143. The lower end of the second dummy trench 142 may be formed at a level lower than a level of a lower end of a first dummy trench 141. In an exemplary embodiment of the present inventive concept, the second dummy trench 142 may be positioned and dimensioned to pass through a first gate electrode G1 (e.g., along the direction orthogonal to the upper surface of the substrate 21), and the lower end of the second dummy trench 142 may be formed at a level higher than a level of an upper end of a substrate 21.

A lower end of a second dummy source line 162 may be formed at a level higher than levels of lower ends of a first main source line 151, a second main source line 152, and a third dummy source line 163. The lower end of the second dummy source line 162 may be formed at a level lower than a level of lower end of a first dummy source line 161. In an exemplary embodiment of the present inventive concept, the lower end of the second dummy source line 162 may be formed at a level higher than the level of the upper end of the substrate 21. For example, the second gate electrode G2 has a first lateral end N1 in a first direction X perpendicular to a vertical direction Y, and the second gate electrode G2 has a second lateral end N2 in the first direction X. The first direction X may be parallel to an upper surface of the substrate 21 and be oriented from the trench 143 toward the trench 141. A first distance DI between the trench 143 and the first lateral end N1 is different from (e.g., greater than) a second distance D2 between the trench 143 and the second lateral end N2.

Figure 4:
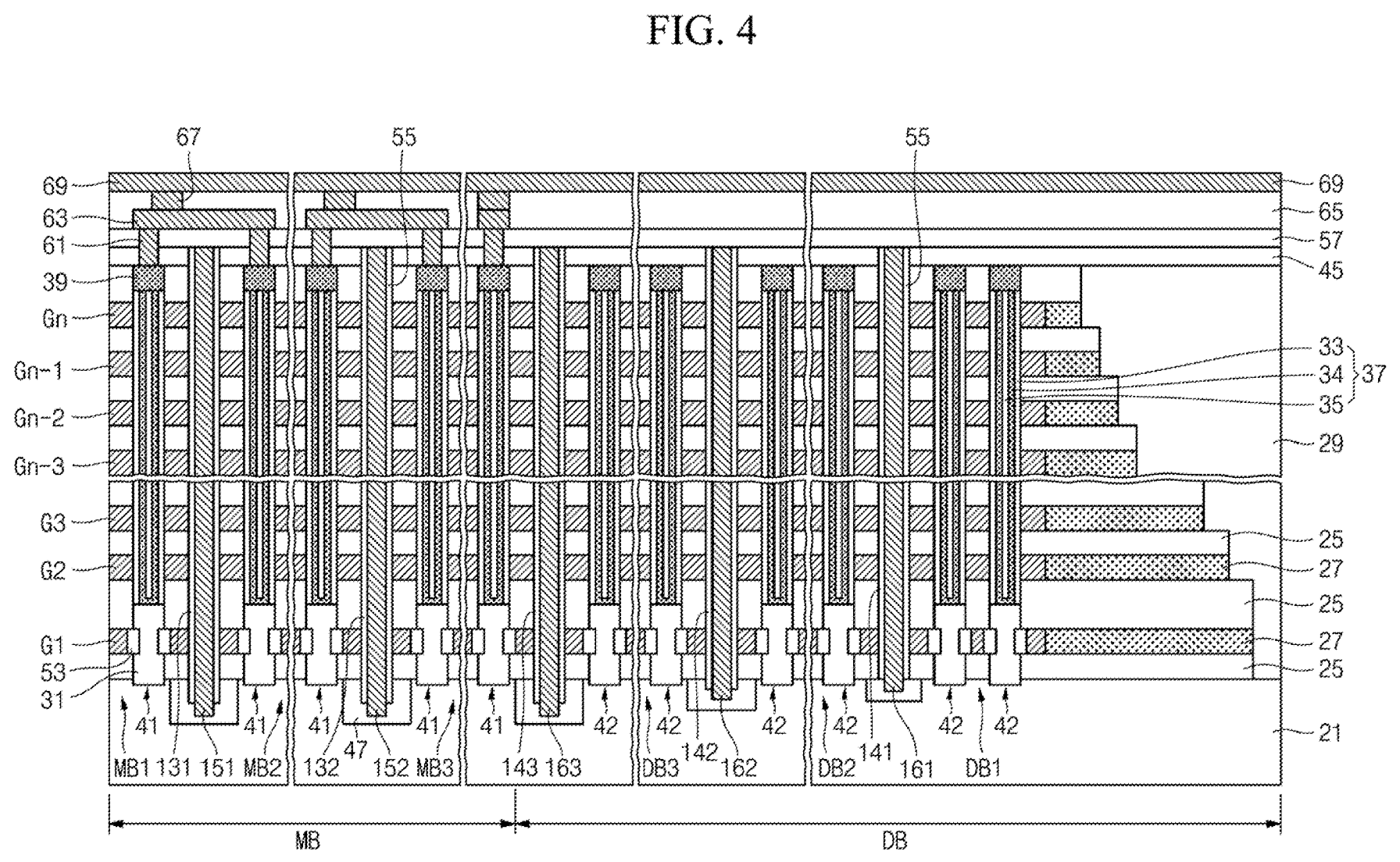

Referring to FIG. 4, a lower end of a second dummy trench 142 may be formed at a level higher than levels of lower ends of a first main trench 131, a second main trench 132, and a third dummy trench 143. The lower end of the second dummy trench 142 may be formed at a level lower than a level of a lower end of a first dummy trench 141. In an exemplary embodiment of the present inventive concept, the lower ends of the second dummy trench 142 and the first dummy trench 141 may be formed at levels lower than a level of an upper end of a substrate 21.

A lower end of a second dummy source line 162 may be formed at a level higher than levels of lower ends of a first main source line 151, a second main source line 152, and a third dummy source line 163. The lower end of the second dummy source line 162 may be formed at a level lower than a level of a lower end of a first dummy source line 161. In an exemplary embodiment of the present inventive concept, the lower ends of the second dummy source line 162 and the first dummy source line 161 may be formed at levels lower than the level of the upper end of the substrate 21.

Figure 5:
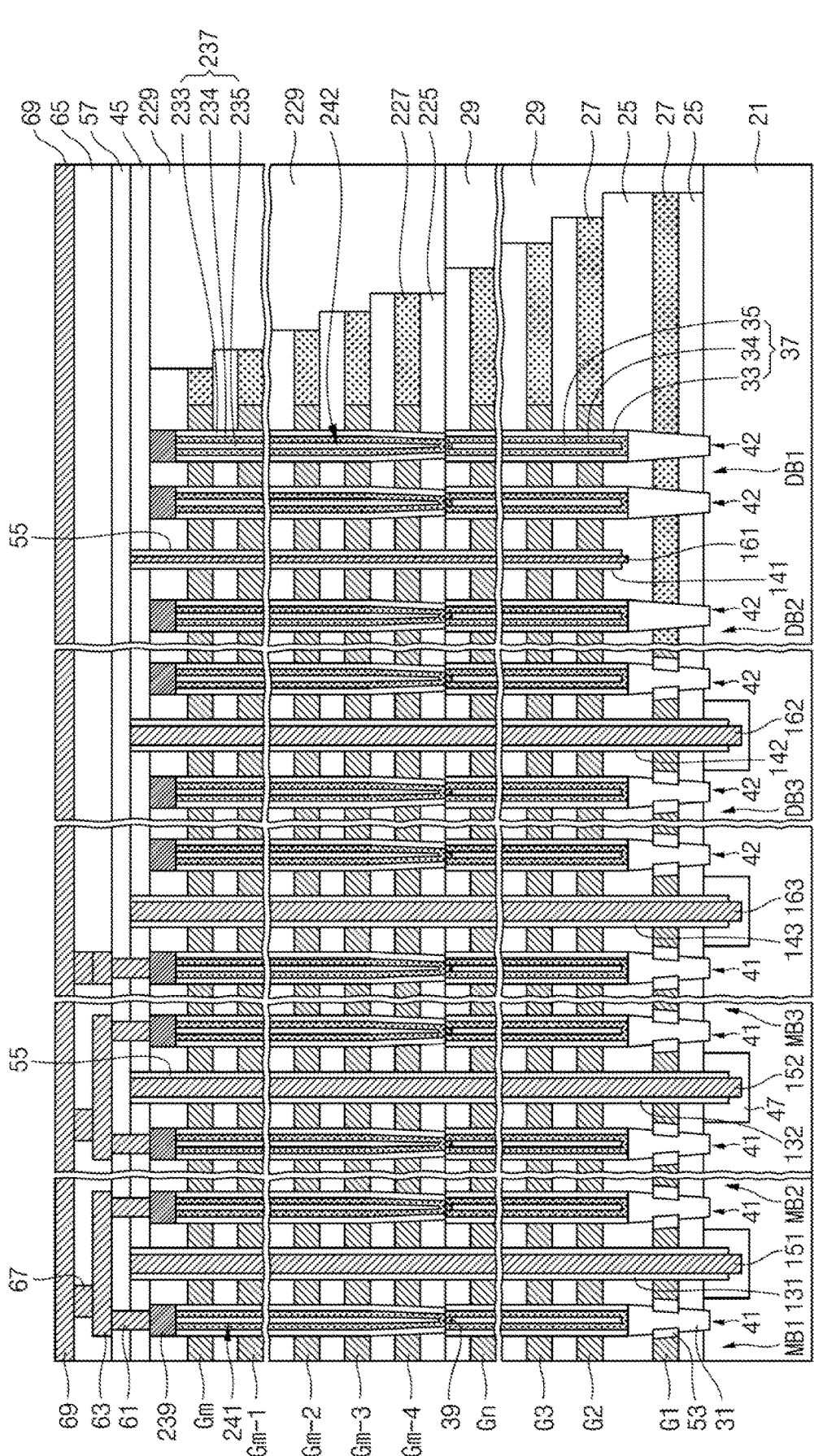

Referring to FIG. 5, the semiconductor device may include lower insulating layers 25, lower mold layers 27, first insulating interlayer 29, lower pillars 41 and 42, upper insulating layers 225, upper mold layers 227, upper pillars 241 and 242, second insulating interlayer 45, trenches 131, 132, 141, 142, and 143, impurity regions 47, gate insulating layer 53, gate electrodes G1 to Gn and Gm-4 to Gm, spacer 55, source lines 151, 152, 161, 162, and 163, third insulating interlayer 57, first bit plugs 61, sub-bit lines 63, fourth insulating interlayer 65, a fifth insulating interlayer 229, second bit plugs 67, and bit lines 69, which are formed on the substrate 21.

The lower insulating layers 25, the lower mold layers 27, the first insulating interlayer 29, the gate electrodes G1 to Gn, and the lower pillars 41 and 42 may be included in a lower stack structure. The upper insulating layers 225, the upper mold layers 227, the gate electrodes Gm-4 to Gm, the upper pillars 241 and 242, and the fifth insulating interlayer 229 may be included in an upper stack structure. The semiconductor device according to an exemplary embodiment of the present inventive concept may have a dual-stack structure. In an exemplary embodiment of the present inventive concept, the semiconductor device may have a multi-stack structure.

The lower pillars 41 and 42 may include lower cell pillars 41 and lower dummy pillars 42. Each of the lower pillars 41 and 42 may include a semiconductor pattern 31, a lower channel structure 37, and a lower conductive pad 39. The lower channel structure 37 may include a lower information storage pattern 33, a lower channel pattern 34, and a lower core pattern 35. The upper pillars 241 and 242 may include upper cell pillars 241 formed on the lower cell pillars 41 and upper dummy pillars 242 formed on the lower dummy pillars 42. Each of the upper pillars 241 and 242 may include an upper channel structure 237 and an upper conductive pad 239. Upper conductive pads 239 may be disposed on top surfaces of each of the upper pillars 241 and 242. The upper channel structure 237 may include an upper information storage pattern 233, an upper channel pattern 234, and an upper core pattern 235.

The upper insulating layers 225, the upper mold layers 227, the fifth insulating interlayer 229, the gate electrodes Gm-4 to Gm, the upper channel structure 237, and the upper conductive pad 239 may include materials which are substantially the same as materials of the lower insulating layers 25, the lower mold layers 27, the first insulating interlayer 29, the gate electrodes G1 to Gn, the lower channel structure

37, and the lower conductive pad 39, respectively, and may be respectively formed using a similar method as for forming the lower insulating layers 25, the lower mold layers 27, the first insulating interlayer 29, the gate electrodes G1 to Gn, the lower channel structure 37, and the lower conductive pad 39.

Figure 6:
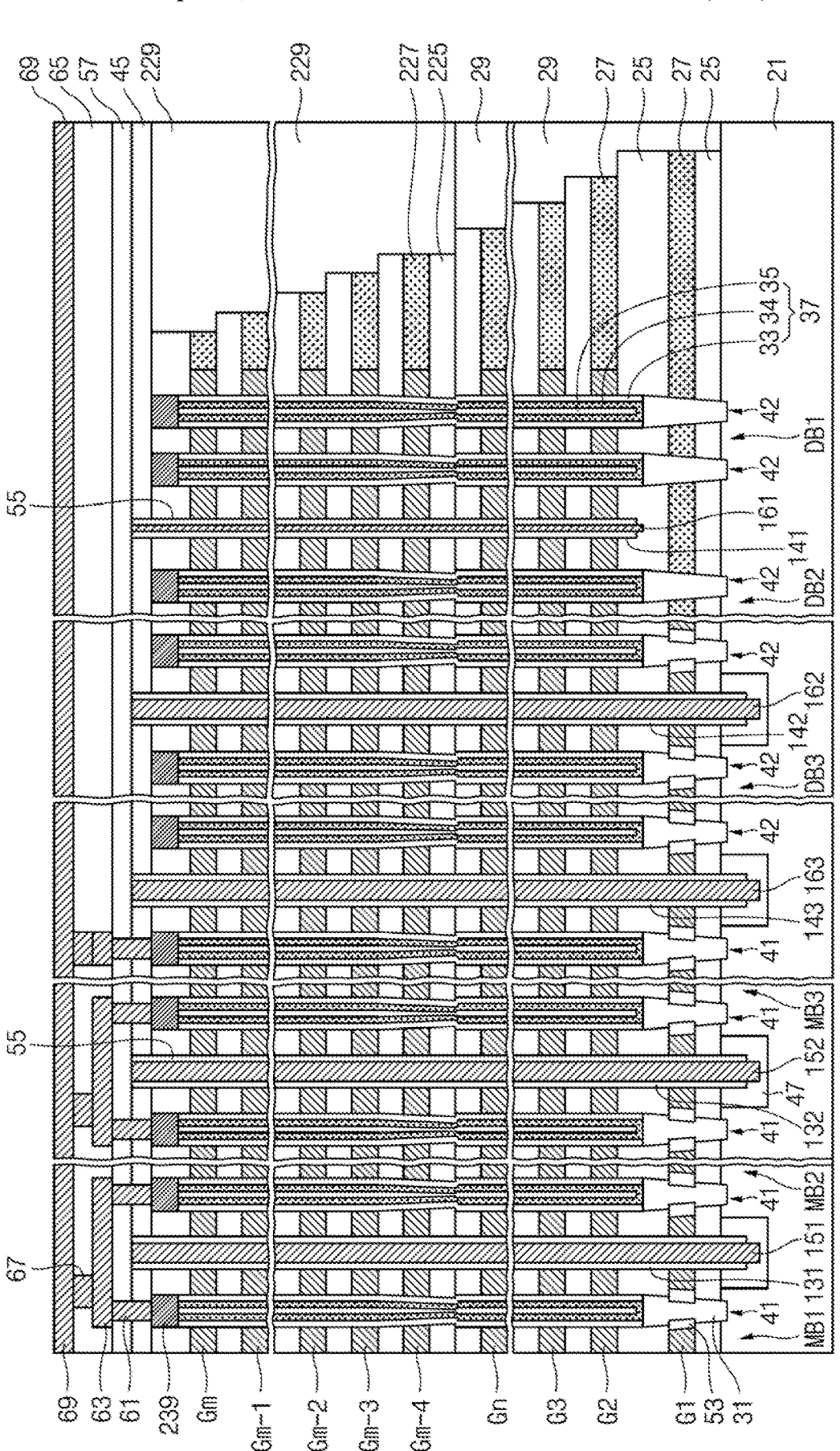
Figures 7, 8:
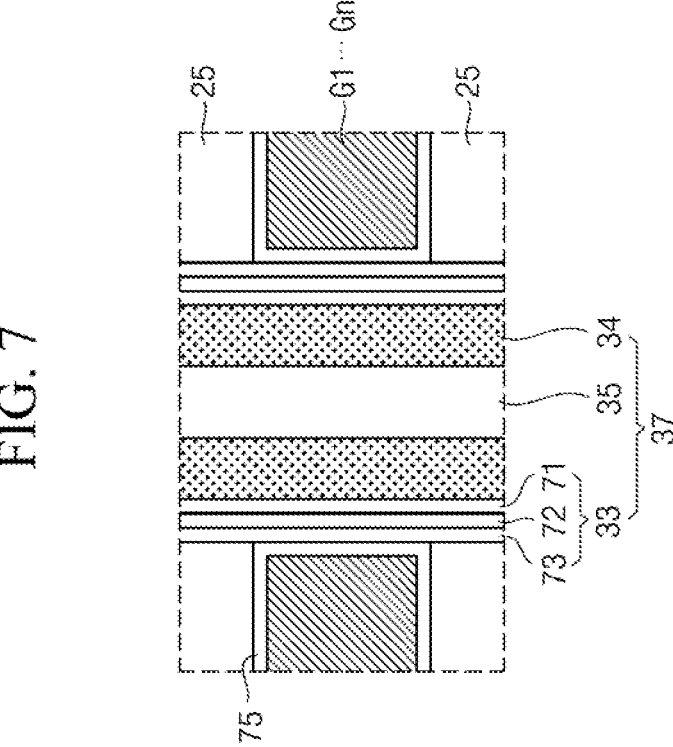
FIGS. 7 and 8 are each partially enlarged views illustrating a part of FIG. 1.

Referring to FIG. 6, the semiconductor device may include lower insulating layers 25, lower mold layers 27, first insulating interlayer 29, upper insulating layers 225, upper mold layers 227, pillars 41 and 42, second insulating interlayer 45, trenches 131, 132, 141, 142, and 143, impurity regions 47, gate insulating layer 53, gate electrodes G1 to Gn and Gm-4 to Gm, spacer 55, source lines 151, 152, 161, 162, and 163, third insulating interlayer 57, first bit plugs 61, sub-bit lines 63, fourth insulating interlayer 65, fifth insulating interlayer 229, second bit plugs 67, and bit lines 69, which are formed on the substrate 21.

The lower insulating layers 25, the lower mold layers 27, the first insulating interlayer 29, and the gate electrodes G1 to Gn may be included in a lower stack structure. The upper insulating layers 225, the upper mold layers 227, the gate electrodes Gm-4 to Gm, and the fifth insulating interlayer 229 may be included in an upper stack structure. The semiconductor device according to an exemplary embodiment of the present inventive concept may have a dual-stack structure. In an exemplary embodiment of the present inventive concept, the semiconductor device may have a multi-stack structure.

The pillars 41 and 42 may include cell pillars 41 and dummy pillars 42. Each of the pillars 41 and 42 may include semiconductor pattern 31, channel structure 37, and conductive pad 239. The channel structure 37 may include information storage pattern 33, channel pattern 34, and core pattern 35. Each of the pillars 41 and 42 may pass through the upper stack structure and the lower stack structure.

According to the an exemplary embodiment of the present inventive concept, the main trenches 131 and 132 defining the main blocks MB1, MB2, and MB3 and the dummy trenches 141, 142, and 143 defining the dummy blocks DB1, DB2, and DB3 may be formed. The main source lines 151 and 152 may be respectively formed inside the main trenches 131 and 132, and the dummy source lines 161, 162, and 163 may be respectively formed inside the dummy trenches 141, 142, and 143. The lower end of the first dummy trench 141 may be formed at a level higher than the levels of the lower ends of the main trenches 131 and 132. The lower end of the first dummy source line 161 may be formed at a level higher than the levels of the lower ends of the main source lines 151 and 152. Due to a configuration of the first dummy trench 141 and the first dummy source line 161, the number of defects occurring at the edge of the cell array region (e.g., at the outermost edge of the dummy block region DB) can be significantly reduced. Thus, sizes and the number of the dummy blocks DB1, DB2, and DB3 can be minimized.

Referring to FIG. 7, the information storage pattern 33 may include a tunnel insulating layer 71, a charge storage layer 72 which surrounds an outer side of the tunnel insulating layer 71, and a first blocking layer 73 which surrounds an outer side of the charge storage layer 72. A second blocking layer 75 may cover upper surfaces and lower surfaces of gate electrodes G1 to Gn and may be disposed between the gate electrodes G1 to Gn and the first blocking layer 73.

Referring to FIG. 8, the information storage pattern 33 may include the tunnel insulating layer 71, the charge storage layer 72 which surrounds an outer side of the tunnel insulating layer 71, and the first blocking layer 73 which surrounds an outer side of the charge storage layer 72. The first blocking layer 73 may be in direct contact with gate electrodes G1 to Gn. The second blocking layer 75 (see FIG. 7) may be omitted and thus the first blocking layer 73 may be in direct contact with gate electrodes CH to Gn when the second blocking layer 75 is omitted.

Figure 9:
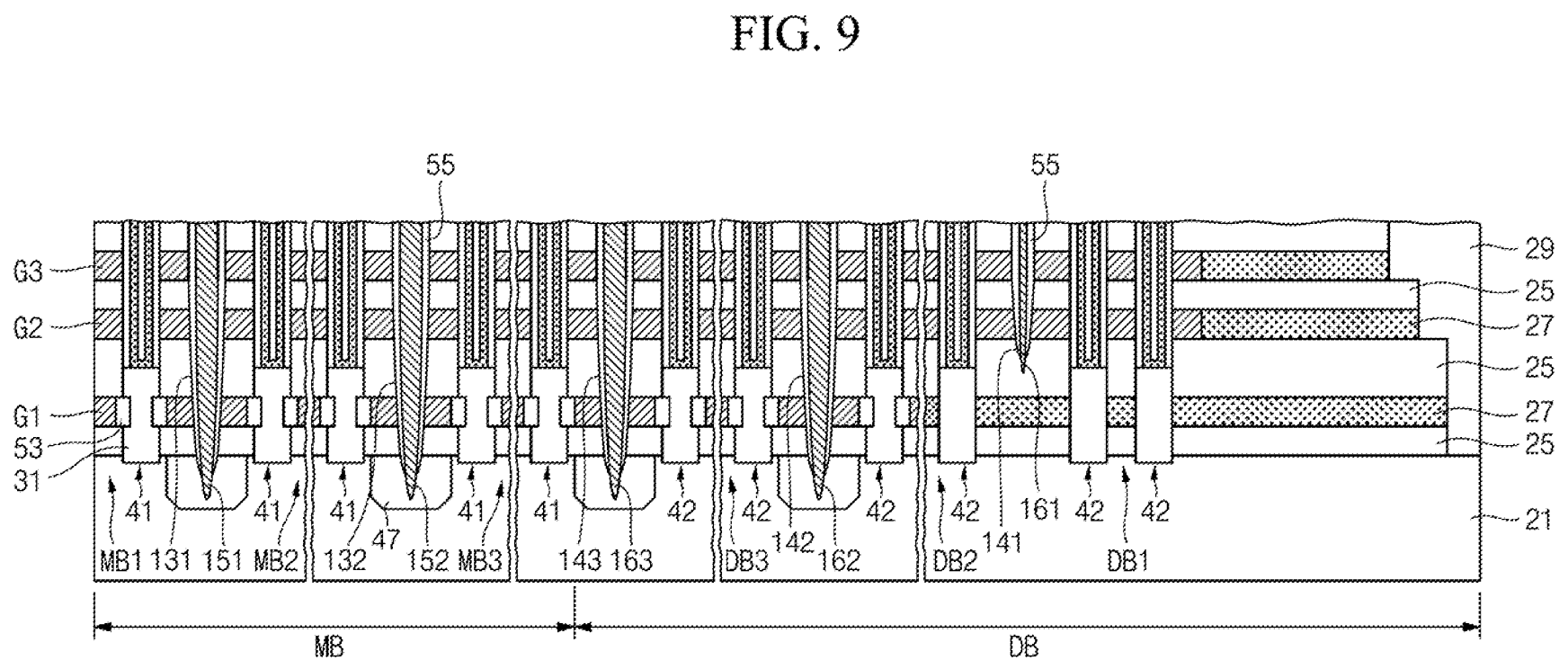

FIG. 9 is a partial cross-sectional view of a semiconductor device according to an exemplary embodiment of the present inventive concept.

Referring to FIG. 9, bottoms of trenches 131, 132, 141, 142, and 143 may be formed to be rounded and pointed. In an exemplary embodiment of the present inventive concept, lower regions of the trenches 131, 132, 141, 142, and 143 may be formed to be tapered along a downward direction (e.g., along the direction orthogonal to the upper surface of the substrate 21). Lower ends of source lines 151, 152, 161, 162, and 163 may be formed to be rounded and pointed. In an exemplary embodiment of the present inventive concept, lower regions of the source lines 151, 152, 161, 162, and 163 may be formed to be tapered along a downward direction (e.g., along the direction orthogonal to the upper surface of the substrate 21).

Figure 10:
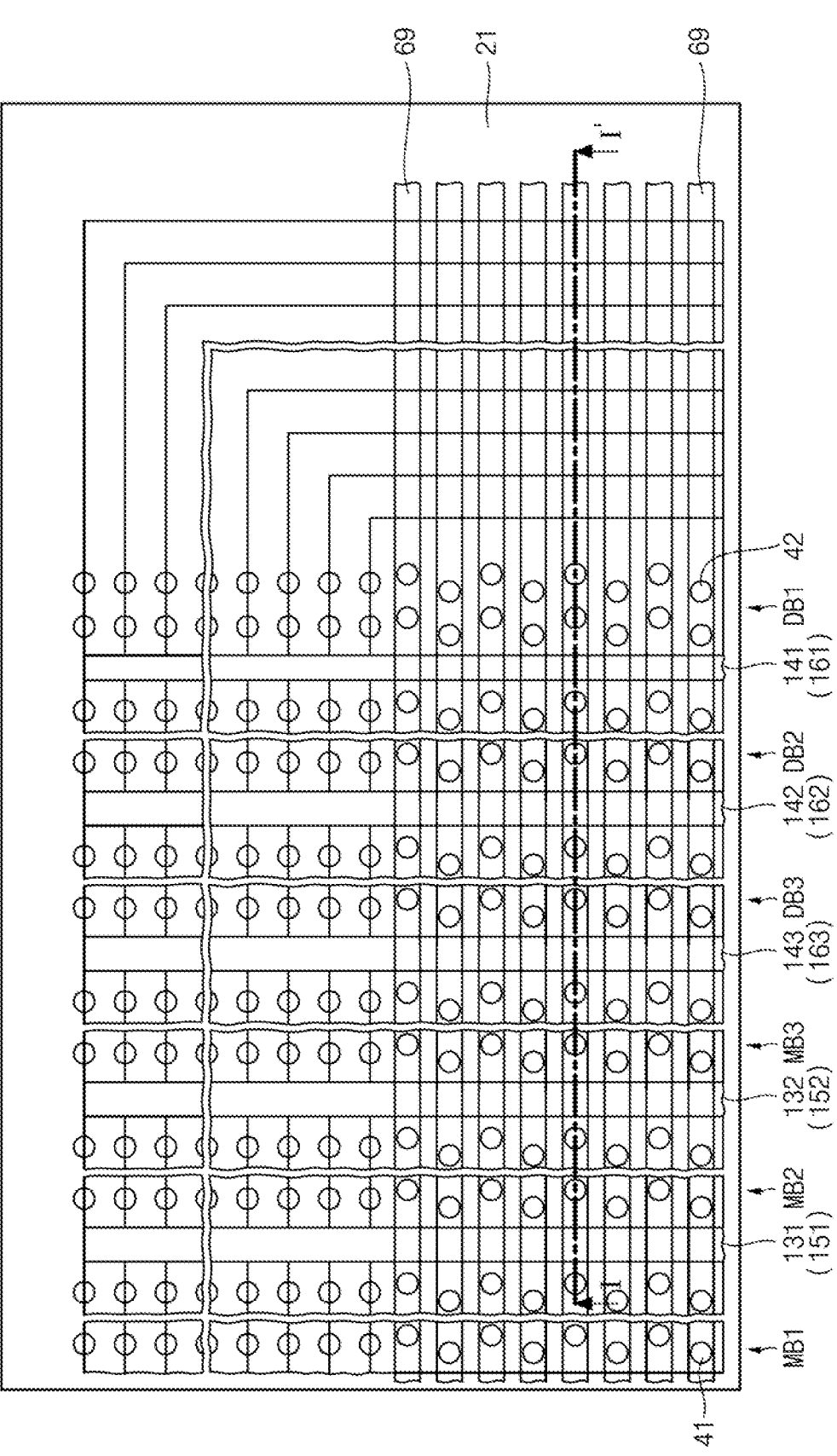
FIG. 10 is a layout view of a semiconductor device according to an exemplary embodiment of the present inventive concept.

FIG. 10 is a layout view of a semiconductor device according to an exemplary embodiment of the present inventive concept. FIGS. 11 to 18 are cross-sectional views taken along line I-I' of FIG. 10 illustrating a method of forming a semiconductor device according to an exemplary embodiment of the present inventive concept. In an exemplary embodiment of the present inventive concept, FIG. 10 may illustrate a part of a cell array region of a VNAND memory.

Figure 11:
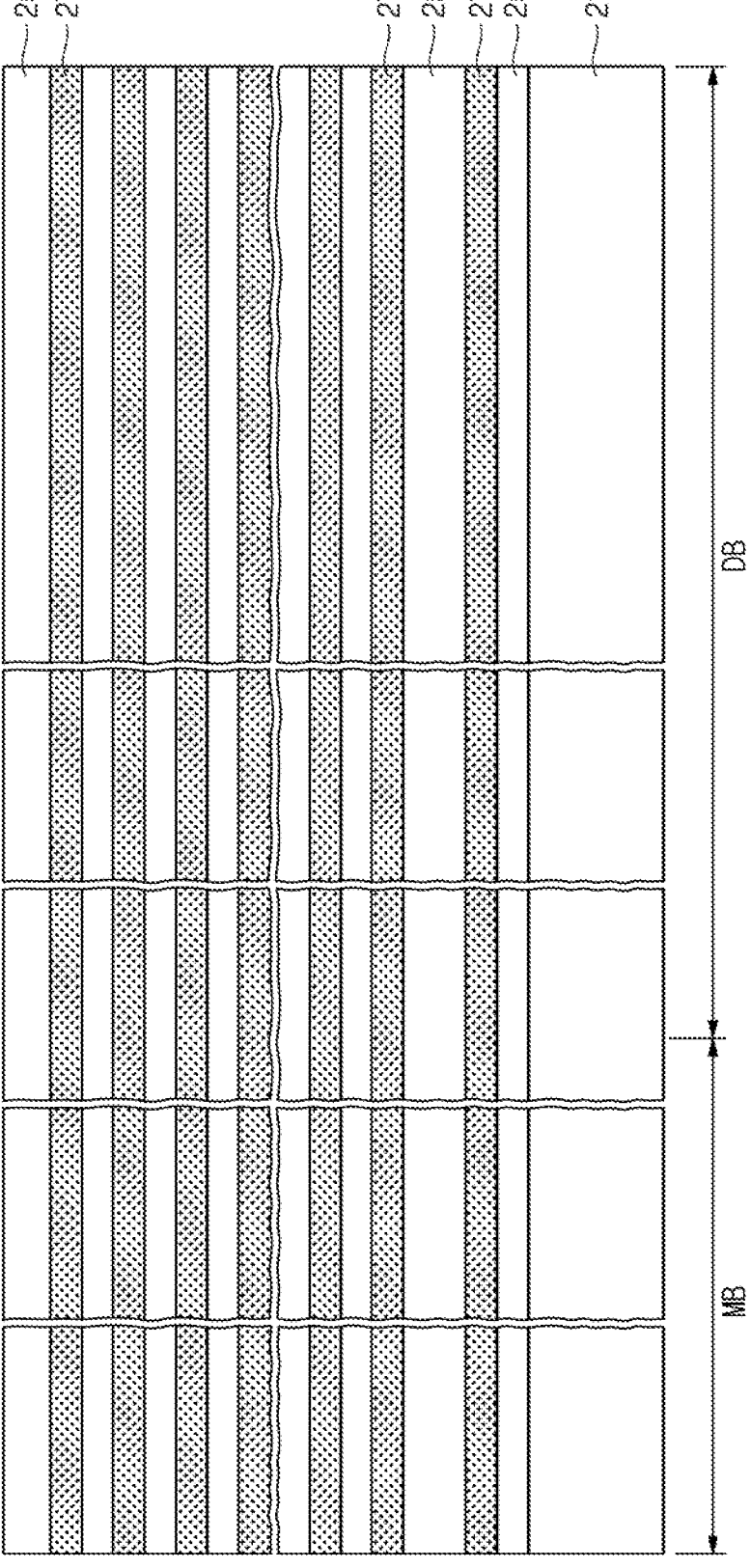

Referring to FIGS. 10 and 11, insulating layers 25 and mold layers 27 may be formed on the substrate 21 having the main block region MB and the dummy block region DB. The insulating layers 25 and the mold layers 27 may be alternately and repeatedly stacked.

The substrate 21 may include a semiconductor substrate such as a silicon wafer or a silicon-on-insulator (SOI) wafer. For example, the substrate 21 may be a single crystalline silicon wafer including P-type impurities such as boron (B).

The mold layers 27 may include a material having etch selectivity with respect to the insulating layers 25. For example, the insulating layers 25 may include silicon oxide, and the mold layers 27 may include silicon nitride. In an exemplary embodiment of the present inventive concept, the insulating layers 25 and the mold layers 27 may be formed in the same chamber as each other using an in-situ process. As an example, the insulating layers 25 and the mold layers 27 may be formed using various types of a chemical vapor deposition (CND) method or an atomic layer deposition (ALD) method.

Figure 12:
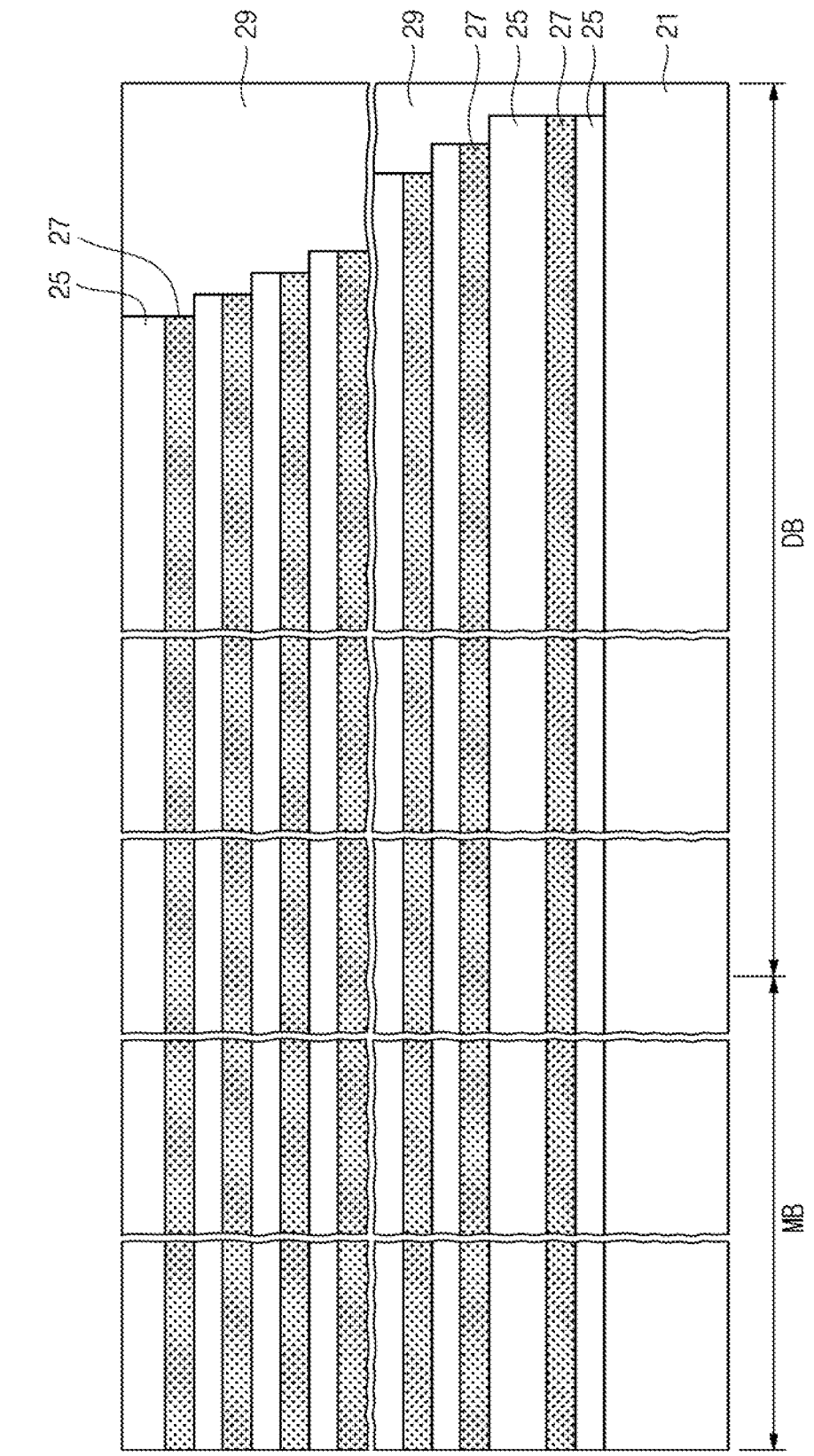

Referring to FIGS. 10 and 12, in an edge of the dummy block region DB, edges of the insulating layers 25 and the mold layers 27 may be patterned and have a stepped structure. A first insulating interlayer 29 may be formed on the substrate 21. The first insulating interlayer 29 may cover the edges of the insulating layers 25 and the mold layers 27, which are formed to have the stepped structure. The edges of the insulating layers 25 and the mold layers 27 may face along a direction parallel to an upper surface of the substrate 21. The first insulating interlayer 29 may include an insulating material such as silicon oxide, silicon nitride, silicon oxynitride, or a combination thereof.

Figure 13:
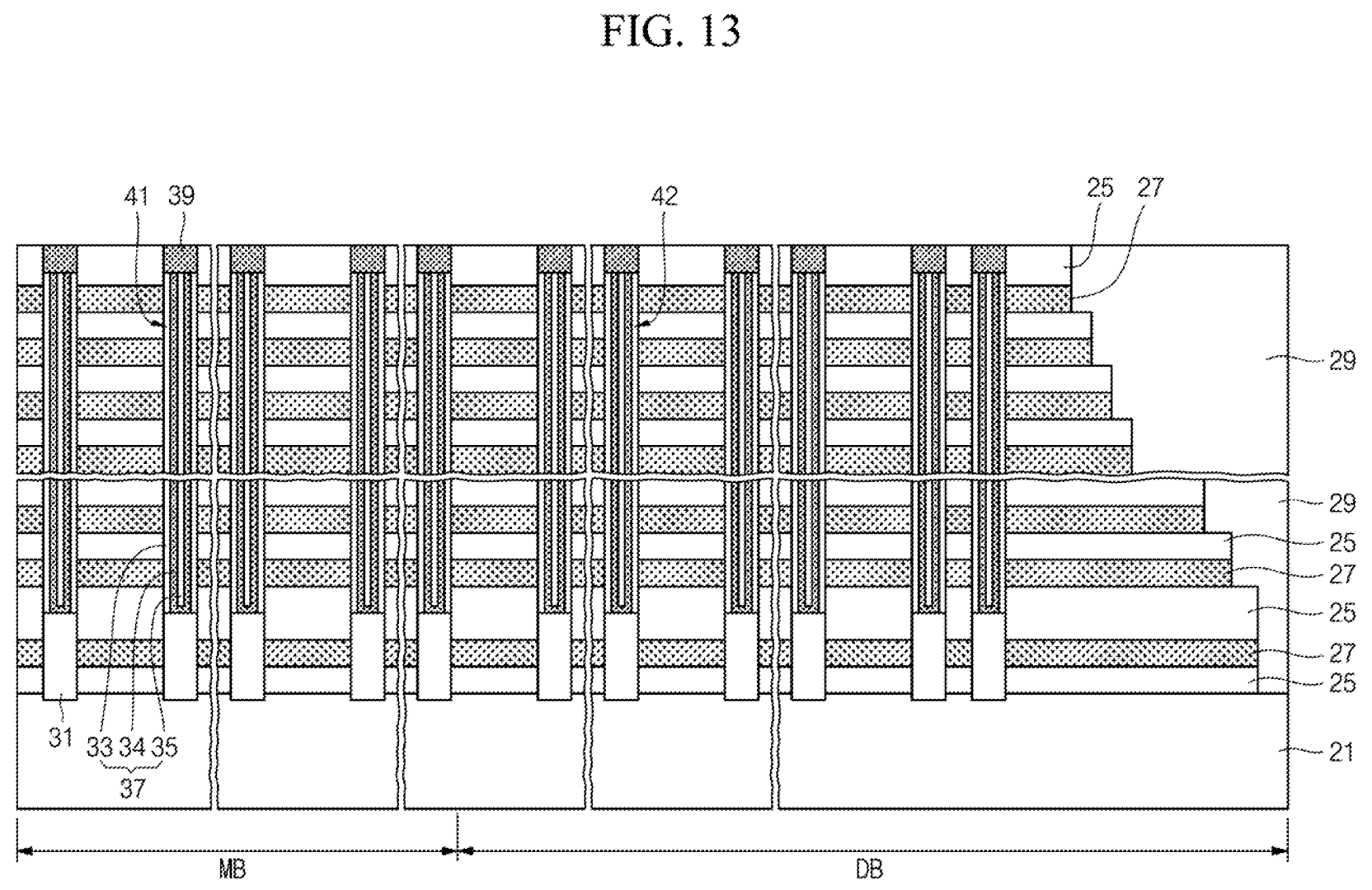

Referring to FIGS. 10 and 13, pillars 41 and 42 may be formed to pass through the insulating layers 25 and the mold layers 27 (e.g., along the direction orthogonal to the upper surface of the substrate 21). The pillars 41 and 42 may include cell pillars 41 formed in the main block region MB and dummy pillars 42 formed in the dummy block region DB. Each of the pillars 41 and 42 may include the semiconductor pattern 31, the channel structure 37, and the conductive pad 39. The channel structure 37 may include the information storage pattern 33, the channel pattern 34, and the core pattern 35.

The semiconductor pattern 31 may be in direct contact with the substrate 21. For example, the semiconductor pattern 31 may be in direct contact with an upper portion of the substrate 21. A lower surface of the semiconductor pattern 31 may be positioned below an upper surface of the substrate 21. The semiconductor pattern 31 may be formed using a selective epitaxial growth (SEG) process. In an exemplary embodiment of the present inventive concept, the semiconductor pattern 31 may include single crystalline silicon having P-type impurities. The channel structure 37 may be formed on the semiconductor pattern 31. A process of forming a plurality of thin films and an etch-back process may be applied as a process of forming the channel structure 37.

The core pattern 35 may include an insulator including silicon oxide, silicon nitride, silicon oxynitride, or a combination thereof. In an exemplary embodiment of the present inventive concept, the core pattern 35 may include polysilicon. The channel pattern 34 may surround a side surface and a lower portion of the core pattern 35. The channel pattern 34 may include a semiconductor layer such as a polysilicon layer. The channel pattern 34 may be in direct contact with the semiconductor pattern 31. The information storage pattern 33 may be formed to surround an outer side of the channel pattern 34.

In an exemplary embodiment of the present inventive concept, (see, e.g., FIGS. 7 and 8), the information storage pattern 33 may include the tunnel insulating layer 71, the charge storage layer 72 which surrounds an outer side of the tunnel insulating layer 71, and the first blocking layer 73 which surrounds an outer side of the charge storage layer 72. The information storage pattern 33 may include a plurality of insulating layers including silicon oxide, silicon nitride, silicon oxynitride, a high-K dielectric, or a combination thereof. In an exemplary embodiment of the present inventive concept, the tunnel insulating layer 71 may include silicon oxide, the charge storage layer 72 may include silicon nitride, and the first blocking layer 73 may include aluminum oxide (AlO).

The conductive pad 39 may be formed on the channel structure 37. The conductive pad 39 may be formed using a process of forming a thin film and a planarization process. The planarization process may include a chemical mechanical polishing (CMP) process, an etch-back process, or a combination thereof. The conductive pad 39 may be in direct contact with the channel structure 37. The conductive pad 39 may include a conductive material such as polysilicon, a metal, a metal silicide, a metal oxide, a metal nitride, conductive carbon, or a combination thereof.

Figure 14:
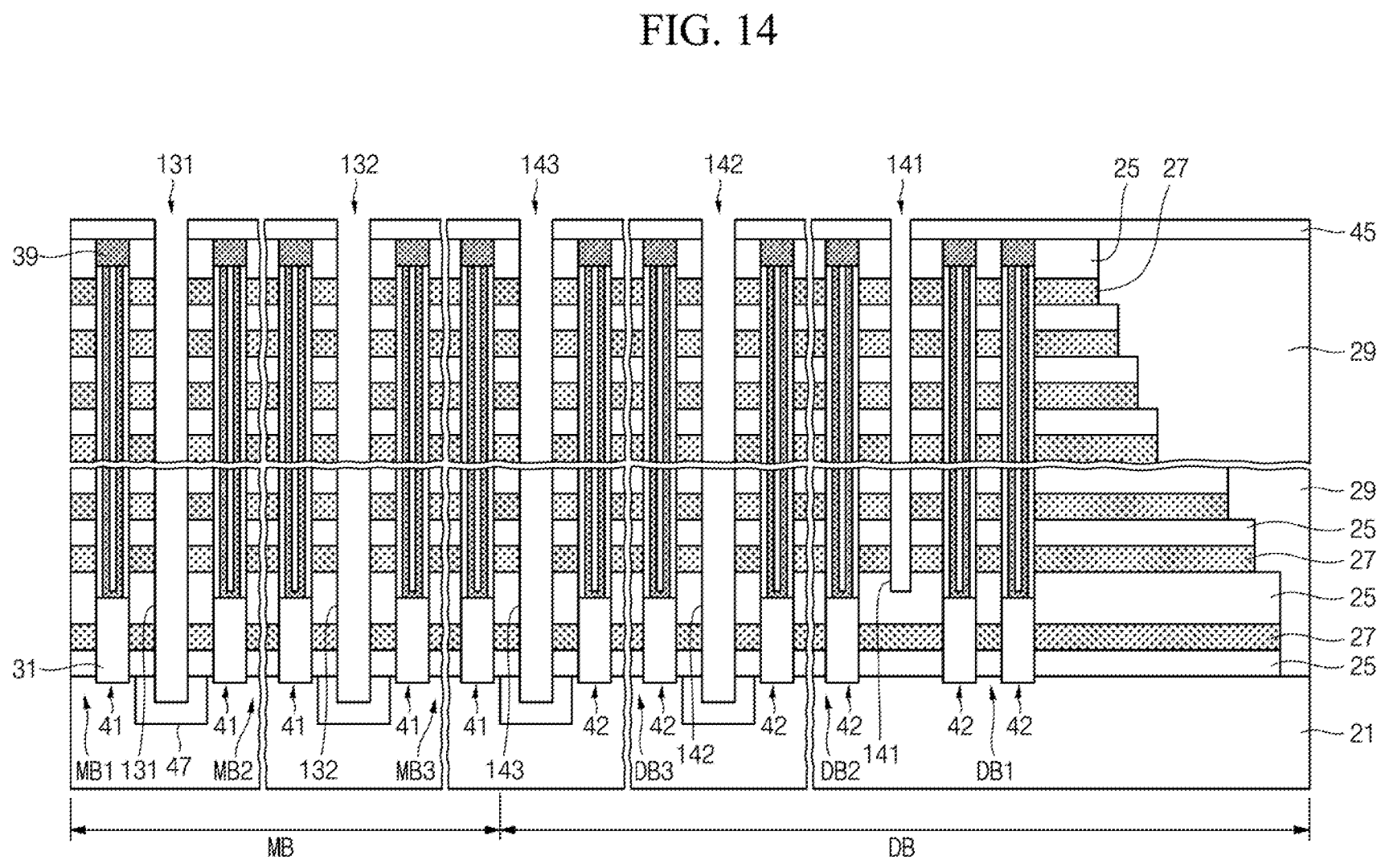

Referring to FIGS. 10 and 14, the second insulating interlayer 45 may be formed to cover the pillars 41 and 42. The second insulating interlayer 45 may include an insulating layer including silicon oxide, silicon nitride, silicon oxynitride, a low-K dielectric, or a combination thereof. Trenches 131, 132, 141, 142, and 143 may be formed to pass through the second insulating interlayer 45, the insulating layers 25, and the mold layers 27 (e.g., along the direction orthogonal to the upper surface of the substrate 21). The trenches 131, 132, 141, 142, and 143 may include a first main trench 131, a second main trench 132, a first dummy trench 141, a second dummy trench 142, and a third dummy trench 143. A first main block MB1, a second main block MB2, a third main block MB3, a first dummy block DB1, a second dummy block DB2, and a third dummy block DB3 may be defined by the trenches 131, 132, 141, 142, and 143.

A patterning process may be applied as a process of forming the trenches 131, 132, 141, 142, and 143. A hard mask pattern may be formed on the second insulating interlayer 45.

The first dummy block DB1 may be defined in an outermost region of the dummy block region DB (e.g., a region of the dummy block region DB relatively furthest away from the main block region MB). The first dummy trench 141 may be formed between the first dummy block DB1 and the second dummy block DB2. The first dummy trench 141 may be formed as an outermost trench among the trenches 131, 132, 141, 142, and 143. The first main trench 131, the second main trench 132, the second dummy trench 142, and the third dummy trench 143 may perpendicularly pass completely through the insulating layers 25 and the mold layers 27 (e.g., along the direction orthogonal to the upper surface of the substrate 21). Lower ends of the first main trench 131, the second main trench 132, the second dummy trench 142, and the third dummy trench 143 may be formed at levels lower than a level of an upper end of the substrate 21.

A lower end of the first dummy trench 141 may be formed at a level higher than the levels of the lower ends of the first main trench 131, the second main trench 132, the second dummy trench 142, and the third dummy trench 143. In an exemplary embodiment of the present inventive concept, the lower end of the first dummy trench 141 may be formed at a level higher than a level of a lowest layer among the mold layers 27. A second layer among the insulating layers 25 may be exposed at a bottom of the first dummy trench 141. Lateral widths of the first main trench 131, the second main trench 132, the second dummy trench 142, and the third dummy trench 143 may be substantially the same as each other. A lateral width of the first dummy trench 141 may be smaller than the lateral width of each of the first main trench 131, the second main trench 132, the second dummy trench 142, and the third dummy trench 143.

Impurity regions 47 may be formed in the substrate 21 at which lower portions of the first main trench 131, the second main trench 132, the second dummy trench 142, and the third dummy trench 143 are exposed. The impurity regions 47 may be formed using an ion implanting process. In an exemplary embodiment of the present inventive concept, the impurity regions 47 may include N-type impurities such as phosphorus (P) or arsenic (As). The impurity regions 47 may correspond to a common source region.

Figure 15:
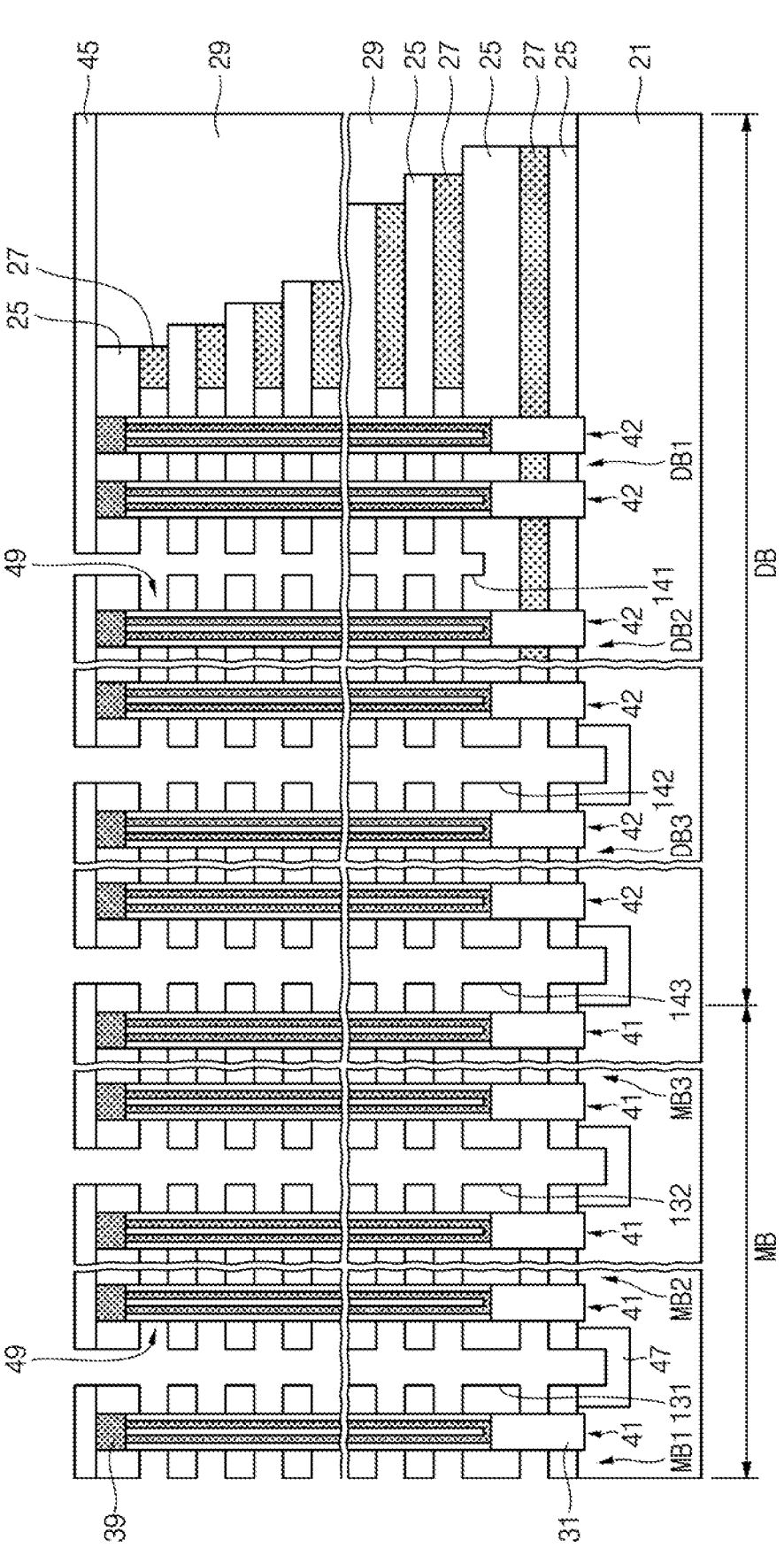

Referring to FIGS. 10 and 15, openings 49 which communicate with (e.g., are connected with) the trenches 131, 132, 141, 142, and 143 may be formed by removing the mold layers 27. An isotropic etching process may be used as a process of removing the mold layers 27. The mold layers 27 may partially remain in the first dummy block DB1 and the second dummy block DB2.

Figure 16:
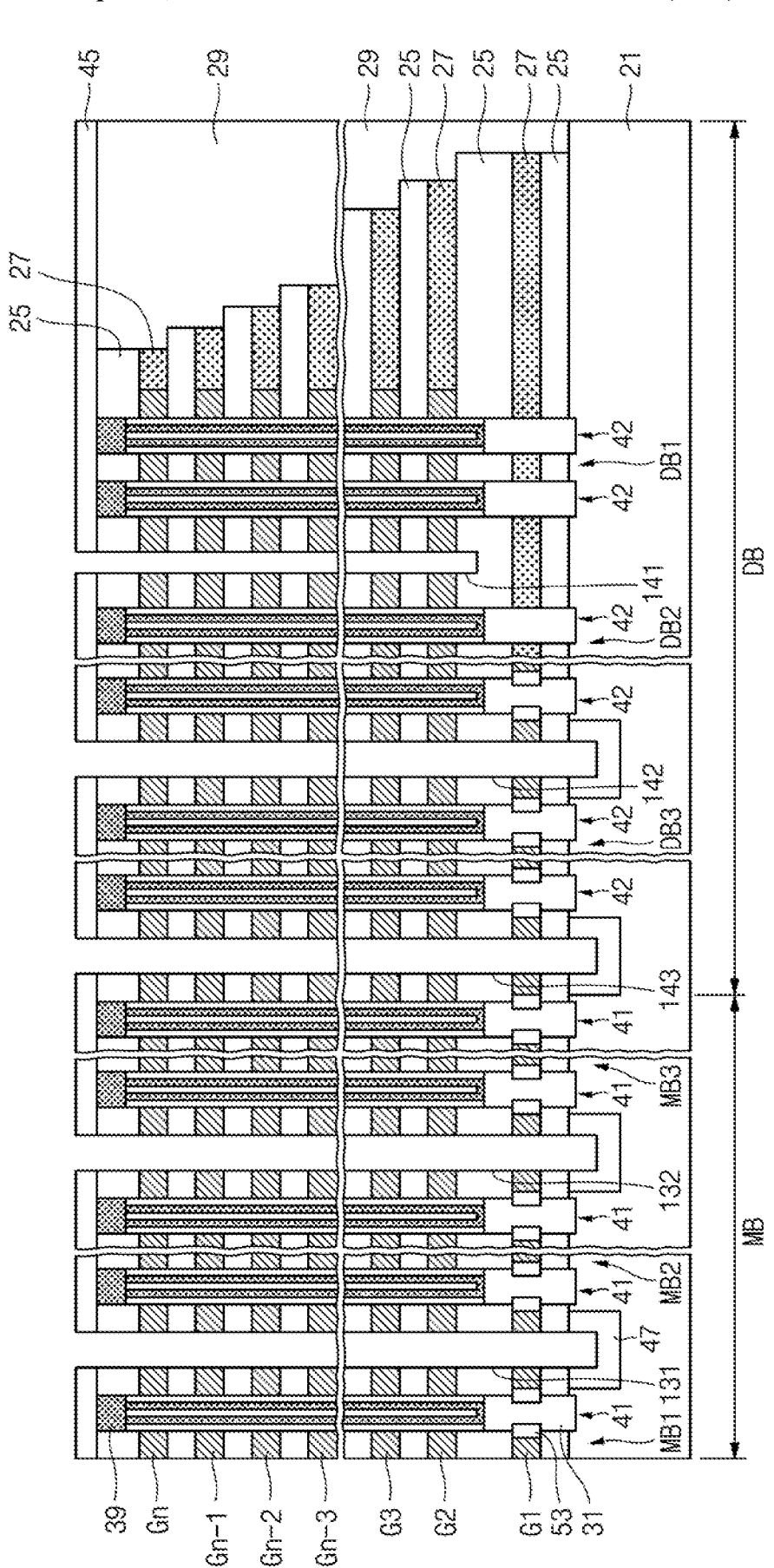

Referring to FIGS. 10 and 16, a gate insulating layer 53 and gate electrodes G1 to Gn may be formed.

The gate insulating layer 53 may be formed on a side surface of the semiconductor pattern 31 exposed inside the openings 49. In an exemplary embodiment of the present inventive concept, the gate insulating layer 53 may include a thermal oxide layer. A process of forming a thin film and an etching process may be applied as a process of forming the gate electrodes G1 to Gn. The etching process may include an anisotropic etching process, an isotropic etching process, or a combination thereof. The gate electrodes G1 to Gn may be formed inside the openings 49. The gate electrodes to Gn may include a conductive material such as a metal, a metal silicide, a metal oxide, a metal nitride, polysilicon, conductive carbon, or a combination thereof. For example, the gate electrodes G1 to Gn may include Ti, TiN, Ta, TaN, W, WN, Ru, Pt, or a combination thereof.

In an exemplary embodiment of the present inventive concept, before the gate electrodes G1 to Gn are formed, the second blocking layer 75 may be formed (see, e.g., FIG. 7). The second blocking layer 75 may cover upper surfaces and lower surfaces of the gate electrodes G1 to Gn and may be disposed between the gate electrodes G1 to Gn and the first blocking layer 73. The second blocking layer 75 may include an insulating layer including silicon oxide, silicon nitride, silicon oxynitride, a high-K dielectric, or a combination thereof.

Figure 17:
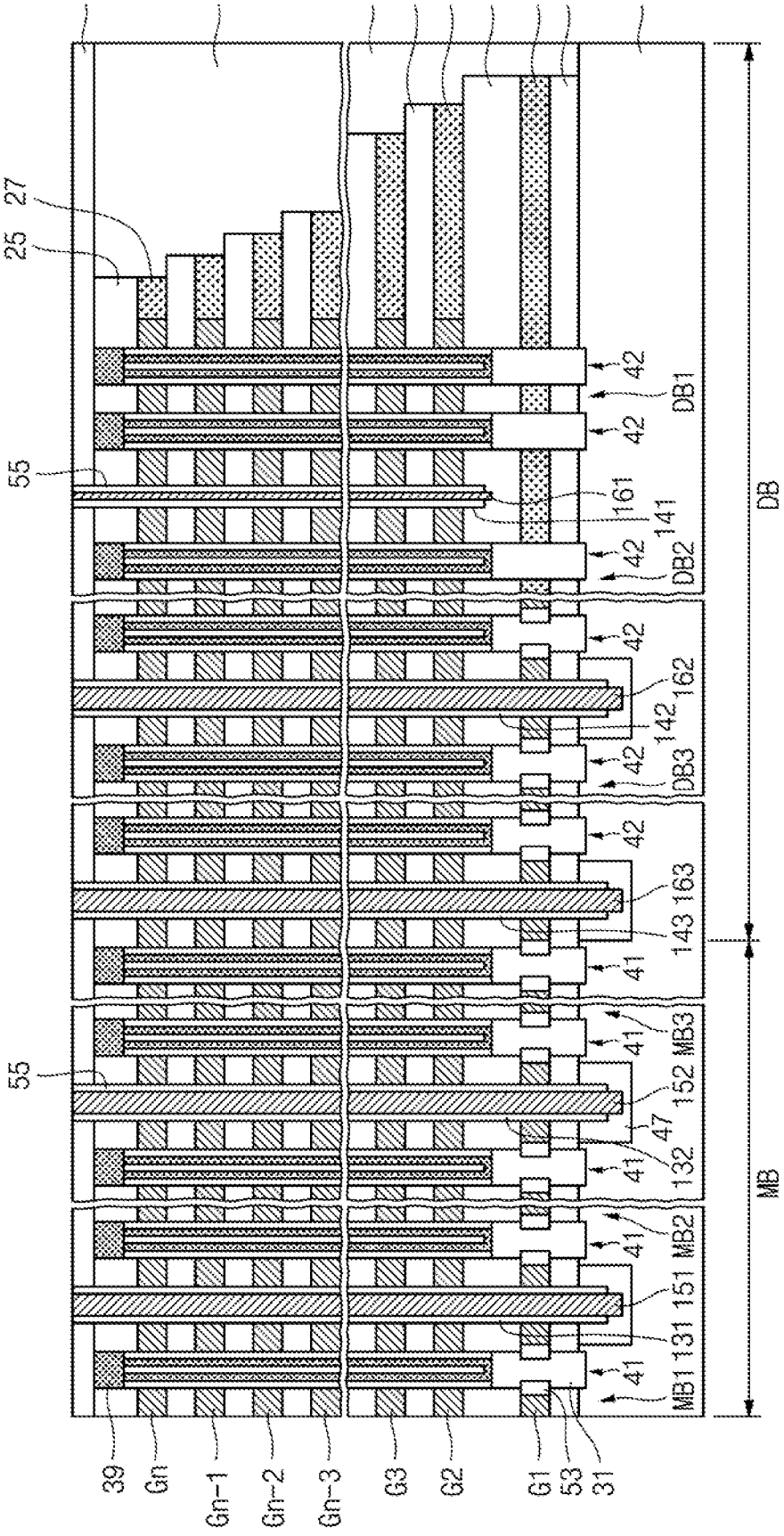

Referring to FIGS. 10 and 17, the spacer 55 and source lines 151, 152, 161, 162, and 163 may be formed inside the trenches 131, 132, 141, 142, and 143. The source lines 151, 152, 161, 162, and 163 may include a first main source line 151, a second main source line 152, a first dummy source line 161, a second dummy source line 162, and a third dummy source line 163.

The spacer 55 may be formed using a process of forming a thin film and an anisotropic etching process. The spacer 55 may cover side walls of the trenches 131, 132, 141, 142, and 143. The spacer 55 may include an insulating layer including silicon oxide, silicon nitride, silicon oxynitride, a high-K dielectric, a low-K dielectric, or a combination thereof. While a process of forming the spacer 55 is performed, bottoms of the trenches 131, 132, 141, 142, and 143 may be recessed downward. The source lines 151, 152, 161, 162, and 163 may substantially fill the trenches 131, 132, 141, 142, and 143.

A process of forming a thin film and a planarization process may be applied as a process of forming the source lines 151, 152, 161, 162, and 163. The source lines 151, 152, 161, 162, and 163 may include a conductive material such as a metal, a metal silicide, a metal oxide, a metal nitride, polysilicon, conductive carbon, or a combination thereof. For example, the source lines 151, 152, 161, 162, and 163 may include a W layer and a Till layer which surrounds a side surface and a lower end of the W layer. The spacer 55 may be disposed between the source lines 151, 152, 161, 162, and 163 and the gate electrodes G1 to Gn. The first main source line 151, the second main source line 152, the second dummy source line 162, and the third dummy source line 163 may be in direct contact with the impurity region 47. A lower end of the first dummy source line 161 may be in direct contact with a second layer among the insulating layers 25. For example, the lower end of the first dummy source line 161 may be positioned between upper and lower surfaces of a second layer among the insulating layers 25.

Lower ends of the first main source line 151, the second main source line 152, the second dummy source line 162, and the third dummy source line 163 may be formed at levels lower than a level of an upper end of the substrate 21. The lower end of the first dummy source line 161 may be formed at a level higher than the levels of the lower ends of the first main source line 151, the second main source line 152, the second dummy source line 162, and the third dummy source line 163. In an exemplary embodiment of the present inventive concept, the lower end of the first dummy source line 161 may be formed at a level higher than a level of a lowest layer among the mold layers 27. Lateral widths of the first main source line 151, the second main source line 152, the second dummy source line 162, and the third dummy source line 163 may be substantially the same as each other. A lateral width of the first dummy source line 161 may be smaller than the lateral width of each of the first main source line 151, the second main source line 152, the second dummy source line 162, and the third dummy source line 163.

In an exemplary embodiment of the present inventive concept, each of the source lines 151, 152, 161, 162, and 163 may include a plurality of source plugs.

Figure 18:
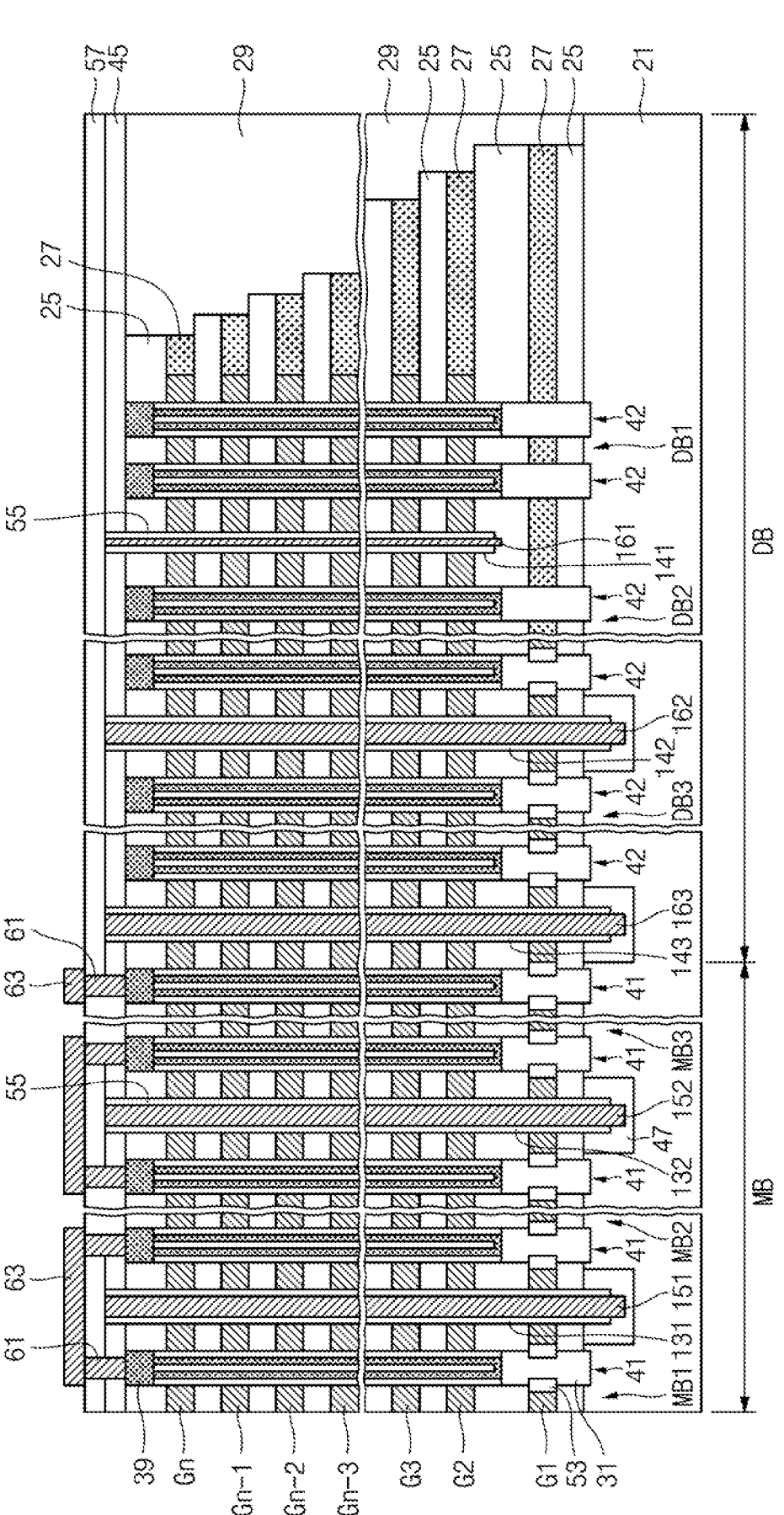

Referring to FIGS. 10 and 18, the third insulating interlayer 57 may be formed on the source lines 151, 152, 161, 162, and 163 and the second insulating interlayer 45. First bit plugs 61 may be formed to pass through the third insulating interlayer 57 and the second insulating interlayer 45 (e.g., along the direction orthogonal to the upper surface of the substrate 21) to be in direct contact with the cell pillars 41. Sub-bit lines 63 may be formed on the third insulating interlayer 57 to be in direct contact with the first bit plugs 61.

The third insulating interlayer 57 may include an insulating layer including silicon oxide, silicon nitride, silicon oxynitride, a low-K dielectric, or a combination thereof. The first bit plugs 61 and the sub-bit lines 63 may include a conductive material such as a metal, a metal silicide, a metal oxide, a metal nitride, polysilicon, conductive carbon, or a combination thereof.

Referring back to FIGS. 1 and 10, the fourth insulating interlayer 65 may be formed to cover the sub-bit lines 63 on the third insulating interlayer 57. Second bit plugs 67 may be formed to pass through the fourth insulating interlayer 65 to be in direct contact with the sub-bit lines 63. Bit lines 69 may be formed on the fourth insulating interlayer 65 to be in direct contact with the second bit plugs 67.

The fourth insulating interlayer 65 may include an insulating layer including silicon oxide, silicon nitride, silicon oxynitride, a low-K dielectric, or a combination thereof. The second bit plugs 67 and the bit lines 69 may include conductive material such as a metal, a metal silicide, a metal oxide, a metal nitride, polysilicon, conductive carbon, or a combination thereof.

Figure 19:
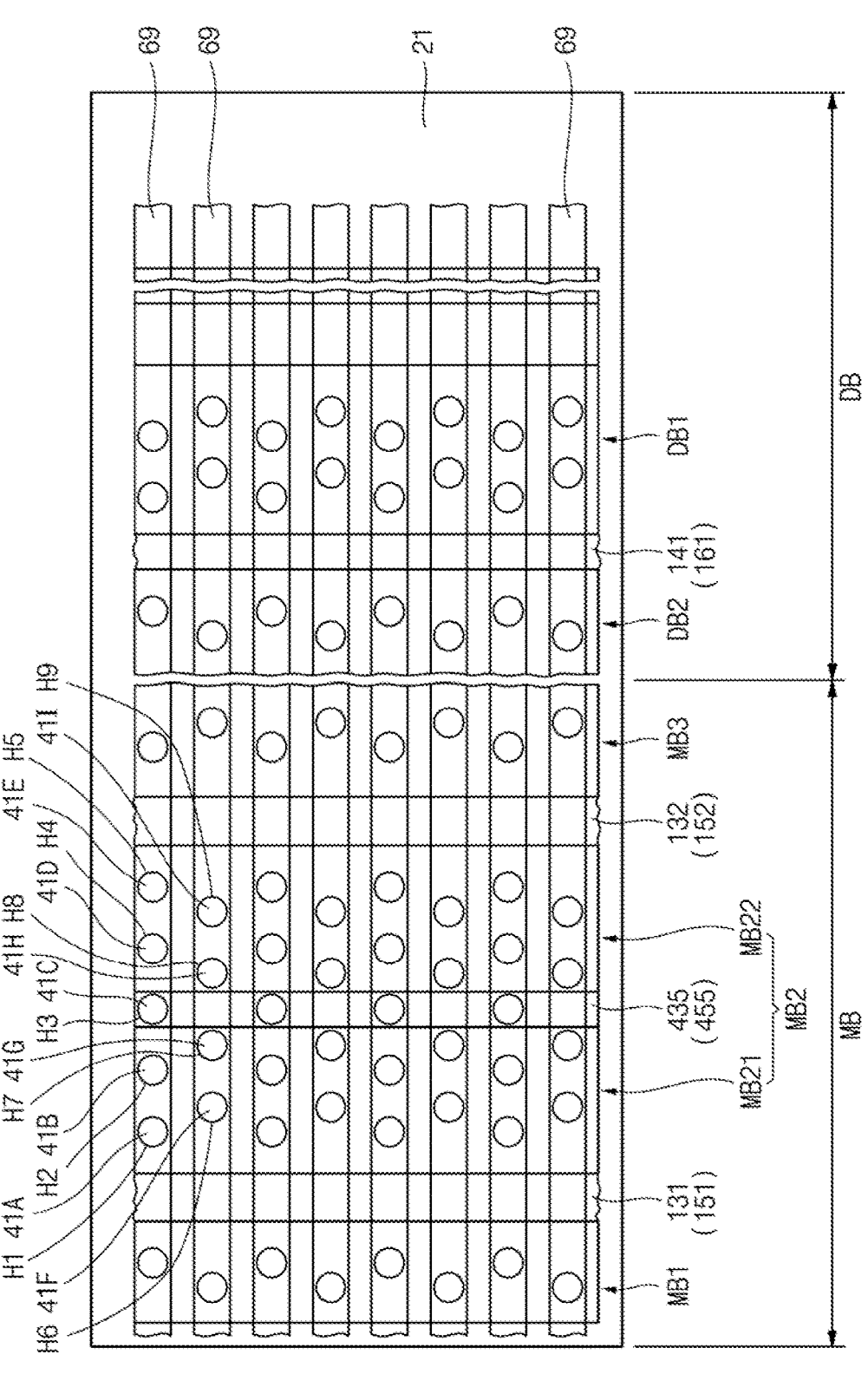
FIG. 19 is a layout view of a semiconductor device according to an exemplary embodiment of the present inventive concept.

FIG. 19 is a layout view of a semiconductor device according to an exemplary embodiment of the present inventive concept.

Referring to FIG. 19, a semiconductor device according to an exemplary embodiment of the present inventive concept may include a cell array region including the main block region MB and the dummy block region DB. The semiconductor device may include first to ninth channel holes H1, H2, H3, H4, H5, H6, H7, H8, and H9, first to ninth cell pillars 41A, 41B, 41C, 41D, 41E, 41F, 41G, 41H, and 41I, the first main trench 131, the second main trench 132, the first dummy trench 141, the first main source line 151, the second main source line 152, the first dummy source line 161, a sub-trench 435, an insulating pattern 455, and bit lines 69, which are formed on the substrate 21 including the main block region MB and the dummy block region DB.

A second main block MB2 may be defined between the first main trench 131 and the second main trench 132. The first to ninth cell pillars 41A, 41B, 41C, 41D, 41E, 4W, 41G, 41H, and 41I may be formed inside the first to ninth channel holes H1, H2, H3, H4, H5, H6, H7, H8, and H9. The second main block MB2 may include the first to fifth channel holes H1, H2, H3, H4, and H15 arranged in a first row direction, the sixth to ninth channel holes H6, H7, H8, and H9 arranged in a second row direction, and the insulating pattern 455 formed inside the sub-trench 435. The first to ninth cell pillars 41A, 41B, 41C, 41D, 41E, 41F, 41G, 41H, and 41I may include a configuration similar to the configuration of the cell pillars 41 described with reference to FIGS. 1 to 6. The insulating pattern 455 may include silicon oxide, silicon nitride, silicon oxynitride, or a combination thereof.

The first channel hole H1 may be adjacent to the first main trench 131, the fifth channel hole H5 may be adjacent to the second main trench 132, the third channel hole H3 may be arranged between the first channel hole H1 and the fifth channel hole H5, the second channel hole H2 may be arranged between the first channel hole H1 and the third channel hole H3, and the fourth channel hole H4 may be arranged between the third channel hole H3 and the fifth channel hole H5. The sixth channel hole H6 may be adjacent to the first main trench 131, the ninth channel hole H9 may be adjacent to the second main trench 132, the seventh channel hole H7 may be arranged between the sixth channel hole H6 and the ninth channel hole H9, and the eighth channel hole H8 may be arranged between the seventh channel hole H7 and the ninth channel hole H9. The sixth channel hole H6 may be arranged between the first channel hole H1 and the second channel hole H2, the seventh channel hole H7 may be arranged between the second channel hole H2 and the third channel hole H113, the eighth channel hole H8 may be arranged between the third channel hole H3 and the fourth channel hole H4, and the ninth channel hole H9 may be arranged between the fourth channel hole H4 and the fifth channel hole H5.

The first main trench 131 may be parallel to the second main trench 132. The sub-trench 435 may be disposed between the first main trench 131 and the second main trench 132. The sub-trench 435 may cross the third channel hole H3 and may extend between the seventh channel hole H7 and the eighth channel hole H8. The second main block MB2 may be divided into a first sub-block MB21 and a second sub-block MB22 by the sub-trench 435. The first sub-block MB21 may include the first channel hole H1, the second channel hole H2, the sixth channel hole H6, and the seventh channel hole H7. The second sub-block MB22 may include the fourth channel hole H4, the fifth channel hole H5, the eighth channel hole H8, and the ninth channel hole H9.

According to an exemplary embodiment of the present inventive concept, main trenches defining main blocks and dummy trenches defining dummy blocks may be provided. Main source lines may be formed inside the main trenches, and dummy source lines may be formed inside the dummy trenches. A lower end of an outermost dummy trench among the dummy trenches may be formed at a level higher than levels of lower ends of the main trenches. A lower end of an outermost dummy source line among the dummy source lines may be formed at a level higher than levels of lower ends of the main source lines. The number of defects occurring at edges of a cell array region can be significantly reduced by the configurations of the outermost dummy trench and the outermost dummy source line. Sizes and the number of the dummy blocks can be minimized. Thus, a semiconductor device having a relatively high degree of integration with a relatively low occurrence of defects may be realized.

While the inventive concept has been particularly shown and described with reference to exemplary embodiments thereof, it will be understood by those of ordinary skill in the art that various changes in form and detail may be made therein without departing from the spirit and scope of the inventive concept.

What is claimed is:

1. A semiconductor device comprising:
a silicon substrate;
a plurality of blocks on the silicon substrate;
a plurality of trenches between the plurality of blocks, the plurality of trenches include a first trench and a second trench adjacent to the first trench;
a first conductive pattern inside the first trench;
a second conductive pattern inside the second trench;
a first spacer insulating layer contacting a side surface of the first conductive pattern; and
a second spacer insulating layer contacting a side surface of the second conductive pattern,
wherein each of the plurality of blocks includes:
    a stack including insulating layers and conductive layers alternately stacked; and
    a plurality of pillars penetrating through the stack and contacting the silicon substrate,
wherein each of the plurality of pillars includes a semiconductor pattern contacting the silicon substrate and an information storage pattern,
wherein the conductive layers include:
    a lowermost conductive layer among the conductive layers;
    a first conductive layer on the lowermost conductive layer; and
    a second conductive layer on the first conductive layer,
wherein the insulating layers include:
    a lowermost insulating layer between the silicon substrate and the lowermost conductive layer;
    a first insulating layer between the lowermost conductive layer and the first conductive layer; and
    a second insulating layer between the first conductive layer and the second conductive layer,
wherein with respect to the silicon substrate, a lowermost end of the first conductive pattern is at a higher level than a lowermost end of the second conductive pattern,
wherein the lowermost end of the first conductive pattern is spaced apart from the silicon substrate,
wherein the lowermost end of the second conductive pattern contacts the silicon substrate, and
wherein with respect to the silicon substrate, the lowermost end of the first conductive pattern and the lowermost end of the second conductive pattern are at a higher level than a lower surface of the silicon substrate.

2. The semiconductor device of claim 1,
wherein each of the first and second conductive patterns extends in a first direction,
wherein the first direction is parallel to an upper surface of the silicon substrate,
wherein the first trench and the second trench penetrate through the lowermost conductive layer,
wherein a lowermost end of the first conductive pattern is at a lower level than an upper surface of the lowermost conductive layer,
wherein the first conductive pattern is spaced apart from the lowermost conductive layer by the first spacer insulating layer, and
wherein the second conductive pattern is spaced apart from the lowermost conductive layer by the second spacer insulating layer.

3. The semiconductor device of claim 2,
wherein the silicon substrate includes a recess region,
wherein a lower surface of the second conductive pattern contacts a bottom of the recess region of the silicon substrate and is at a lower level than the uppermost surface of the silicon substrate, and
wherein a portion of the second spacer insulating layer is between the second conductive pattern and a sidewall of the recess region.

4. The semiconductor device of claim 1,
wherein a thickness of the first insulating layer is greater than a thickness of the lowermost insulating layer.

5. The semiconductor device of claim 1,
wherein the first trench and the second trench penetrate through the lower most conductive layer,
wherein a lowermost end of the first conductive pattern is at a lower level than a lower surface of the lowermost conductive layer,
wherein the first conductive pattern is spaced apart from the lowermost conductive layer by the first spacer insulating layer, and
wherein the second conductive pattern is spaced apart from the lowermost conductive layer by the second spacer insulating layer.

6. The semiconductor device of claim 1, further comprising gate insulating layers,
wherein each of the pillars further includes:
    an insulating core pattern on the semiconductor pattern; and
    a channel pattern on a side surface of the insulating core pattern and between the insulating core pattern and the semiconductor pattern,
wherein the information storage pattern is between the channel pattern and the conductive layers,
wherein an upper surface of each of the semiconductor patterns is at a higher level than the lowermost conductive layer and is at a lower level than the first conductive layer, and
wherein the gate insulating layers are between the lowermost conductive layer and the semiconductor patterns of the pillars.

7. The semiconductor device of claim 1,
wherein the first conductive pattern has a first width at a first height level with respect to the silicon substrate;
wherein the second conductive pattern has a second width at the first height level, and wherein the second width is different from the first width.

8. The semiconductor device of claim 7,
wherein the first height level is at the same level as a lower surface of the first conductive layer with respect to the silicon substrate.

9. The semiconductor device of claim 8,
wherein the second width is greater than the first width.

10. The semiconductor device of claim 1,
wherein the first trench is an outermost trench among the plurality of trenches.

11. The semiconductor device of claim 1,
wherein the silicon substrate including an impurity region,
wherein the first conductive pattern is spaced apart from the impurity region of the silicon substrate,
wherein the second conductive pattern contacts the impurity region of the silicon substrate, and
wherein each of the first and second conductive patterns includes polysilicon.

12. The semiconductor device of claim 1, wherein the second conductive pattern includes a lower region,
wherein the lower region of the second conductive pattern is at a lower level than an upper surface of the silicon substrate, a width of the lower region of the second conductive pattern gradually decreases in a downward direction, and wherein the downward direction is oriented from an upper surface of the first conductive pattern toward the lowermost end of the first conductive pattern.

13. The semiconductor device of claim 1, further comprising:

first bit plugs; and a bit line, wherein the plurality of pillars include cell pillars connected to the first bit plugs and dummy pillars not connected to the first bit plugs, wherein the bit line vertically overlaps the cell pillars, the dummy pillars, the first conductive pattern, and the second conductive pattern, and wherein the first bit plugs are between the bit line and the cell pillars.

14. The semiconductor device of claim 13, further comprising:

second bit plugs connected to the bit line, wherein with respect to the silicon substrate, the second bit plugs are at a higher level than the first bit plugs and are at a lower level than the bit line.

15. A semiconductor device comprising:

a substrate;

a stack on the substrate;

a plurality of pillars penetrating through the stack and contacting the substrate;

a first trench penetrating through at least a portion of the stack;

a second trench through the stack and adjacent to the first trench;

first bit plugs;

second bit plugs; and a bit line, wherein the stack includes insulating layers and conductive layers alternately stacked, wherein the conductive layers include:

a lowermost conductive layer among the conductive layers;

a first conductive layer on the lowermost conductive layer; and second conductive layers spaced apart from each other in a vertical direction and on the first conductive layer, wherein the first conductive layer has a first lateral end in a first direction, wherein the lowermost conductive layer has a second lateral end in the first direction, wherein the first direction is parallel to an upper surface of the substrate and is oriented from the second trench toward the first trench, wherein a first distance between the second trench and the first lateral end is different from a second distance between the second trench and the second lateral end, wherein a lowermost end of the first trench is at a different level from a lowermost end of the second trench, wherein each of the plurality of pillars includes an information storage pattern and a semiconductor pattern contacting the substrate, wherein with respect to the substrate, the lowermost end of the first trench and the lowermost end of the second trench are at a higher level than a lower surface of the substrate, wherein the plurality of pillars include cell pillars connected to the first bit plugs and dummy pillars not connected to the first bit plugs, wherein the bit line vertically overlaps the cell pillars, the dummy pillars, the first trench, and the second trench, wherein the first bit plugs are between the bit line and the cell pillars, wherein the second bit plugs are connected to the bit line, and wherein with respect to the substrate, the second bit plugs are at a higher level than the first bit plugs and are at a lower level than the bit line.

16. The semiconductor device of claim 15, further comprising:

a first conductive pattern inside the first trench;

a second conductive pattern inside the second trench;

a first spacer insulating layer contacting a side surface of the first conductive pattern; and a second spacer insulating layer contacting a side surface of the second conductive pattern, wherein the first trench penetrates through the lowermost conductive layer, the first conductive layer and the second conductive layers, wherein the second trench penetrates through the lowermost conductive layer, the first conductive layer and the second conductive layers, and wherein a lowermost end of the first conductive pattern is at a higher level than a lowermost end of the second conductive pattern, with respect to the substrate.

17. The semiconductor device of claim 16, wherein the substrate is a silicon substrate including an impurity region, wherein the first conductive pattern is spaced apart from the impurity region of the silicon substrate, and wherein the second conductive pattern contacts the impurity region of the silicon substrate.

18. The semiconductor device of claim 15, wherein the first distance is greater than the second distance.

\*　　\*　　\*　　\*　　\*